(12) United States Patent
Glew et al.

(10) Patent No.: US 9,711,261 B2
(45) Date of Patent: Jul. 18, 2017

(54) COMPOSITIONS, METHODS, AND DEVICES PROVIDING SHIELDING IN COMMUNICATIONS CABLES

(71) Applicant: Cable Components Group, LLC, Pawcatuck, CT (US)

(72) Inventors: Charles A. Glew, Charlestown, RI (US); David Braun, North Attleborough, MA (US)

(73) Assignee: Cable Components Group, LLC, Pawcatuck, CT (US)

( * ) Notice: Subject to any disclaimer, the term of this patent is extended or adjusted under 35 U.S.C. 154(b) by 331 days.

(21) Appl. No.: 13/795,808

(22) Filed: Mar. 12, 2013

(65) Prior Publication Data
US 2013/0248240 A1 Sep. 26, 2013

Related U.S. Application Data

(60) Provisional application No. 61/610,211, filed on Mar. 13, 2012.

(51) Int. Cl.
*H05K 9/00* (2006.01)
*H01B 11/04* (2006.01)
*C08K 3/08* (2006.01)
*H01B 11/08* (2006.01)
*H01B 7/295* (2006.01)
(Continued)

(52) U.S. Cl.
CPC ............... *H01B 11/04* (2013.01); *C08K 3/08* (2013.01); *C08K 7/00* (2013.01); *H01B 3/004* (2013.01); *H01B 3/445* (2013.01); *H01B 7/295* (2013.01); *H01B 11/002* (2013.01); *H01B 11/08* (2013.01); *H01B 11/1895* (2013.01); *H05K 9/0081* (2013.01); *H05K 9/0098* (2013.01)

(58) Field of Classification Search
CPC ...... H01B 11/04; H01B 11/08; H05K 9/0081; H05K 9/0098
USPC .............. 174/110 R, 113 R, 113 C, 115, 116
See application file for complete search history.

(56) References Cited

U.S. PATENT DOCUMENTS 3,049,584 A 8/1962 D'Ascoli
3,819,443 A 6/1974 Simons et al.
(Continued)

FOREIGN PATENT DOCUMENTS

EP 554174 B1 4/2000
EP 1 162 632 A2 12/2001
(Continued)

OTHER PUBLICATIONS

PCT Notification of Transmittal of the International Search Report and the Written Opinion of the International Searching Authority, or the Declaration, PCT/US2013/030395, mailed Nov. 7, 2013 (17 pages).
(Continued)

*Primary Examiner* — Courtney Smith
*Assistant Examiner* — Christopher L Augustin
(74) *Attorney, Agent, or Firm* — Reza Mollaaghababa; Thomas J. Engellenner; Pepper Hamilton LLP

(57) ABSTRACT

Compositions, devices, and methods for providing shielding communications cables are provided. In some embodiments, compositions including electrically conductive elements are disclosed. In other embodiments, cable separators, tapes, and nonwoven materials including various electrically conductive elements are disclosed.

23 Claims, 16 Drawing Sheets

(51) Int. Cl.
*C08K 7/00* (2006.01)
*H01B 3/00* (2006.01)
*H01B 3/44* (2006.01)
*H01B 11/00* (2006.01)
*H01B 11/18* (2006.01)

(56) References Cited

U.S. PATENT DOCUMENTS

| | | |
|---|---|---|
| 4,125,739 A | 11/1978 | Bow et al. |
| 4,199,224 A | 4/1980 | Oestreich |
| 4,271,104 A | 6/1981 | Anderson et al. |
| 4,361,381 A | 11/1982 | Williams |
| 4,605,818 A | 8/1986 | Arroyo et al. |
| 4,621,169 A | 11/1986 | Petinelli |
| 4,701,345 A | 10/1987 | Giatras et al. |
| 4,745,238 A | 5/1988 | Kotthaus et al. |
| 4,755,629 A | 7/1988 | Beggs et al. |
| 4,960,318 A | 10/1990 | Nilsson et al. |
| 4,985,185 A | 1/1991 | Mayr et al. |
| 5,146,528 A | 9/1992 | Gleim et al. |
| 5,322,899 A | 6/1994 | Grunewalder et al. |
| 5,418,878 A | 5/1995 | Sass et al. |
| 5,433,252 A | 7/1995 | Wolf et al. |
| 5,438,333 A | 8/1995 | Perkins et al. |
| 5,444,184 A | 8/1995 | Hassel |
| 5,525,988 A | 6/1996 | Perkins et al. |
| 5,544,270 A | 8/1996 | Clark et al. |
| 5,569,876 A | 10/1996 | Podgorski |
| 5,789,711 A | 8/1998 | Gaeris et al. |
| 5,821,466 A | 10/1998 | Clark et al. |
| 5,887,243 A | 3/1999 | Harvey et al. |
| 5,920,032 A | 7/1999 | Aeschbacher et al. |
| 5,922,155 A | 7/1999 | Clouet et al. |
| 5,952,615 A | 9/1999 | Prudhon |
| 5,969,295 A | 10/1999 | Boucino et al. |
| 5,990,419 A | 11/1999 | Bogese, II |
| 6,008,455 A | 12/1999 | Lindstrom et al. |
| 6,074,503 A | 6/2000 | Clark et al. |
| 6,091,025 A | 7/2000 | Cotter et al. |
| 6,150,612 A | 11/2000 | Grandy et al. |
| 6,222,130 B1 | 4/2001 | Gareis et al. |
| 6,365,836 B1 | 4/2002 | Blouin et al. |
| 6,410,137 B1 | 6/2002 | Bunyan |
| 6,410,140 B1 | 6/2002 | Land et al. |
| 6,545,081 B1 | 4/2003 | Nashihata et al. |
| 6,553,749 B2 | 4/2003 | Land et al. |
| 6,573,456 B2 | 6/2003 | Spruell et al. |
| 6,596,944 B1 | 7/2003 | Clark et al. |
| 6,639,152 B2 | 10/2003 | Glew et al. |
| 6,680,922 B1 | 1/2004 | Jorgensen |
| 6,686,537 B1 | 2/2004 | Gareis et al. |
| 6,687,437 B1 | 2/2004 | Starnes et al. |
| 6,689,958 B1 | 2/2004 | McKenney et al. |
| 6,748,146 B2 | 6/2004 | Parris |
| 6,751,441 B1 | 6/2004 | Murray et al. |
| 6,792,184 B2 | 9/2004 | Conrad et al. |
| 6,800,811 B1 | 10/2004 | Boucino |
| 6,812,408 B2 | 11/2004 | Clark et al. |
| 6,818,832 B2 | 11/2004 | Hopkinson et al. |
| 6,855,889 B2 | 2/2005 | Gareis |
| 7,015,398 B2 | 3/2006 | Vexler et al. |
| 7,024,081 B2 | 4/2006 | Dowd et al. |
| 7,256,351 B2 | 8/2007 | Dillon |
| 7,637,776 B2 | 12/2009 | McNutt et al. |
| 8,536,450 B2* | 9/2013 | Aumoitte ............... H01B 9/028 174/36 |
| 2002/0132905 A1* | 9/2002 | Babinee et al. ............. 524/495 |
| 2003/0096897 A1 | 5/2003 | Nielson et al. |
| 2003/0111241 A1* | 6/2003 | Bahlmann ............ H01B 11/085 174/367 |
| 2004/0002559 A1 | 1/2004 | Troutman et al. |
| 2004/0055779 A1 | 3/2004 | Wiekhorst et al. |
| 2004/0055781 A1 | 3/2004 | Comibert et al. |
| 2004/0118593 A1 | 6/2004 | Augustine et al. |
| 2004/0130843 A1 | 7/2004 | Tsusui et al. |
| 2004/0149483 A1 | 8/2004 | Glew |
| 2004/0198875 A1 | 10/2004 | Kaprinidis et al. |
| 2004/0216914 A1 | 11/2004 | Vexler et al. |
| 2004/0217329 A1 | 11/2004 | Easter |
| 2004/0256139 A1 | 12/2004 | Clark et al. |
| 2005/0006126 A1* | 1/2005 | Aisenbrey ............ B29C 45/0013 174/68.1 |
| 2005/0006132 A1 | 1/2005 | Clark |
| 2005/0006133 A1 | 1/2005 | Greiner |
| 2005/0023028 A1 | 2/2005 | Clark |
| 2005/0029007 A1 | 2/2005 | Nordin et al. |
| 2005/0051355 A1 | 3/2005 | Bricker et al. |
| 2005/0056454 A1 | 3/2005 | Clark |
| 2005/0063650 A1 | 3/2005 | Castellani et al. |
| 2005/0103518 A1* | 5/2005 | Glew .................. G02B 6/4459 174/113 R |
| 2007/0102188 A1 | 5/2007 | Glew |
| 2007/0199729 A1 | 8/2007 | Siegel et al. |
| 2010/0200269 A1* | 8/2010 | Camp et al. ............. 174/113 C |
| 2011/0278058 A1* | 11/2011 | Sundararaj ............ H05K 9/009 174/520 |

FOREIGN PATENT DOCUMENTS

| | | |
|---|---|---|
| EP | 0957484 B1 | 11/2004 |
| EP | 2034491 A2 | 3/2009 |
| GB | 2227033 A | 6/1990 |
| GB | 2227033 A | 7/1990 |
| GB | 2350476 A | 11/2000 |
| JP | 04-332406 | 11/1992 |
| JP | 07122123 A2 | 5/1995 |
| KR | 100898587 B1 | 5/2009 |
| KR | 20090092630 A | 9/2009 |
| WO | 1996024143 | 8/1996 |
| WO | 9848430 A1 | 10/1998 |
| WO | 2004021367 | 3/2004 |
| WO | 2004042446 A1 | 5/2004 |
| WO | 2005012411 A1 | 2/2005 |

OTHER PUBLICATIONS

International Search Report, PCT/US2013/030395, mailed Jul. 2, 2013 (2 pages.).
International Search Report of PCT/US2013/030395, mailed Oct. 29, 2013.
International Search Report, PCT/US2013/030395, mailed Oct. 29, 2013 (7 pages.).
PCT International Preliminary Report on Patentability and Written Opinion, PCT/US2013/030395, mailed Sep. 25, 2014 (11 pages).

* cited by examiner

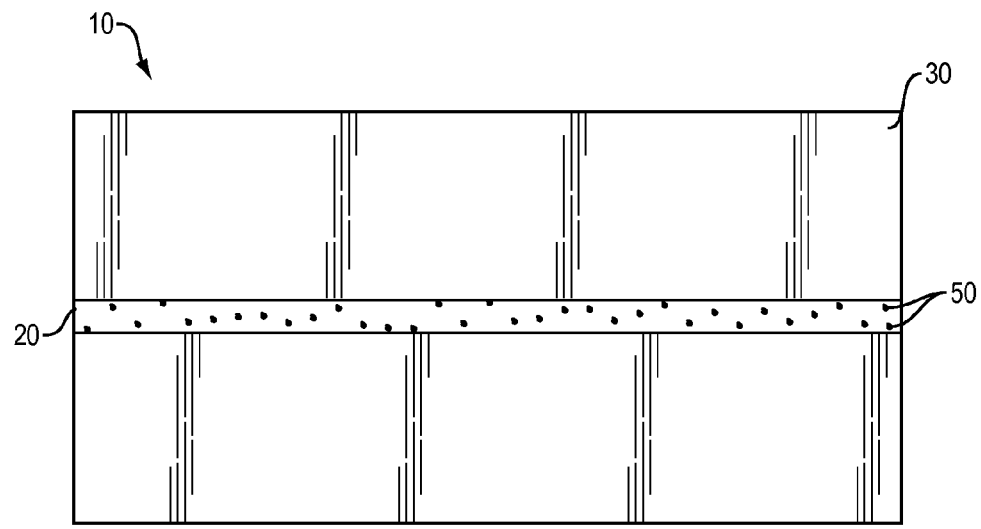
FIG. 2B
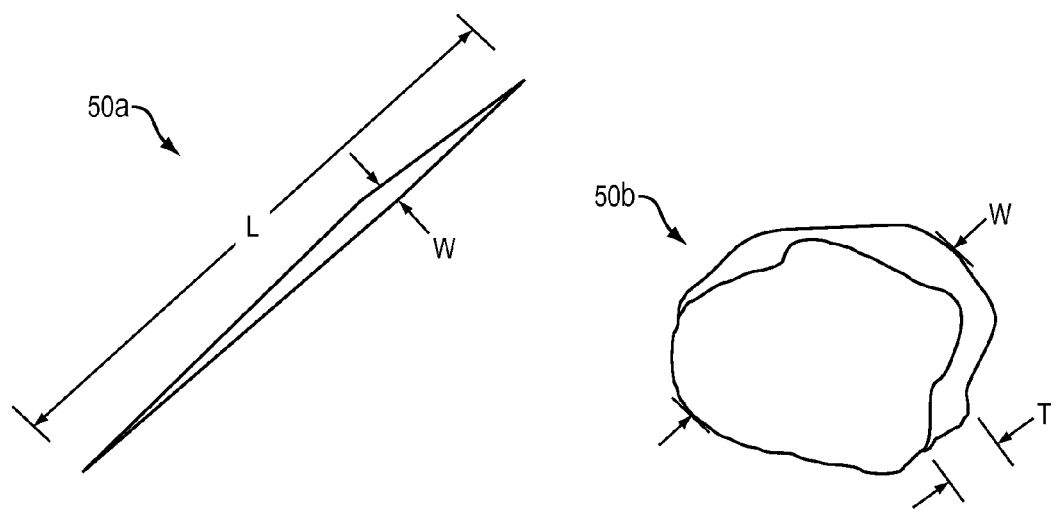
FIG. 3A
FIG. 3B

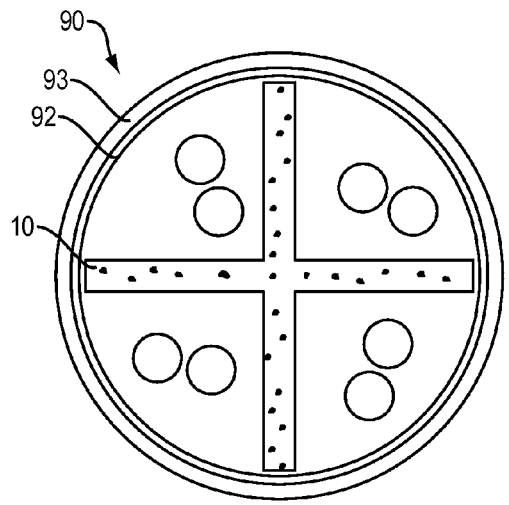
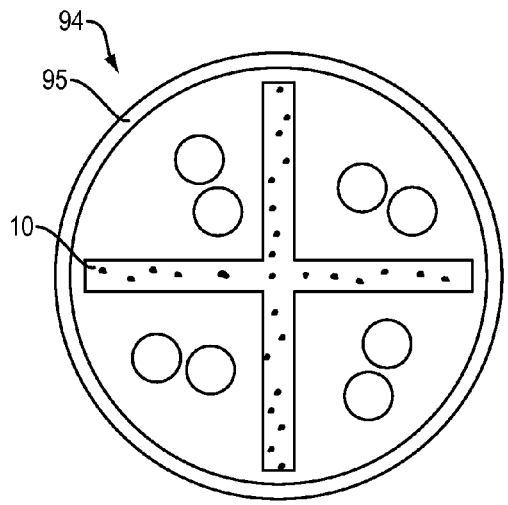
FIG. 6A    FIG. 6B
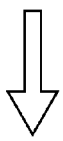
FIG. 7

COMPOSITIONS, METHODS, AND DEVICES PROVIDING SHIELDING IN COMMUNICATIONS CABLES

RELATED APPLICATIONS

This application claims priority to U.S. Provisional Application Ser. No. 61/610,211 filed on Mar. 13, 2012, the content of which is hereby incorporated by reference in its entirety.

FIELD OF THE INVENTION

This invention relates generally to compositions, methods, and devices for providing shielding of communications cables.

BACKGROUND OF THE INVENTION

A broad range of electrical conductors and electrical cables are installed in modern buildings for a wide variety of uses. Such uses include, among others, data transmission between computers, voice communications, video communications, power transmission over communications cables, e.g. power over Ethernet, as well as control signal transmission for building security, fire alarm, and temperature control systems. These cable networks extend throughout modern office and industrial buildings, and frequently extend through the space between the dropped ceiling and the floor above. Ventilation system components are also frequently extended through this space for directing heated and chilled air to the space below the ceiling and also to direct return air exchange. The horizontal space between the dropped ceiling and the floor above is commonly referred to as the "plenum" area. Similarly, the vertical space of the walls between the floor and the ceiling include the networking of the aforementioned cable types. These vertical spaces are generally called the "riser" cabling space. Electrical conductors and cables extending through plenum areas are governed by special provisions of the National Electric Code ("NEC"). Cables intended for installation in the air handling spaces (e.g., plenums, risers, ducts, etc.) of buildings are specifically required by NEC/CEC/IEC to pass flame test specified by Underwriters Laboratories Inc. (UL), UL-910, or its Canadian Standards Association (CSA) equivalent, the FT-6. The UL-910, FT-6 and the NFPA 262, which represent the top of the fire rating hierarchy established by the NEC and CEC, respectively. Also applicable are the UL 1666 Riser test and the IEC 60332-3C and D flammability criteria. Cables possessing these ratings, generally known as "plenum" or "plenum rated" or "riser" or "riser rated", may be substituted for cables having a lower rating (e.g., CMR, CM, CMX, FT4, FTI or their equivalents), while lower rated cables may not be used where plenum or riser rated cables are required.

Many communication systems utilize high performance cables. These high performance cables normally have four or more twisted pairs of conductors for transmitting data and receiving data. A transmitting twisted pair and a receiving twisted pair often form a subgroup in a cable having four twisted pairs. Other high performance cables can include coaxial cables, e.g., used singly or in conjunction with twisted pairs as a composite cable.

In a conventional cable, each twisted pair of conductors has a specified distance between twists along the longitudinal direction. That distance is referred to as the pair lay. When adjacent twisted pairs have the same pair lay and/or twist direction, they tend to lie within a cable more closely spaced than when they have different pair lays and/or twist directions. Such close spacing increases the amount of undesirable energy transferred between conductors, which is commonly referred to as cross-talk. Undesirable energy may also be transferred between adjacent cables (which is known as alien crosstalk) or alien near-end cross talk (anext) or alien far-end cross talk (afext).

The Telecommunications Industry Association and Electronics Industry Association (TIA/EIA) have defined standards for crosstalk, including TIA/EIA-568 A, B, and C including the most recent edition of the specification. The International Electrotechnical Commission (IEC) has also defined standards for data communication cable cross-talk, including ISO/IEC 11801. One high-performance standard for 100 MHz cable is ISO/IEC 11801, Category 5, or more recently referred to as Category 5e. Additionally, more stringent standards have been implemented for higher frequency cables including Category 6, augmented Category 6 (Category $6_A$), Category 7, augmented Category 7 (Category 7A) which are rated for frequencies in the range of 1 MHz through 1 GHz.

There remains a need for communications cables that can operate reliably while minimizing or eliminating cross-talk between conductors within a cable or alien cross-talk between cables, and also a need for separators for use in such telecommunications cables. There also remains a need for communications cables that can provide low smoke generation and overall flame retardancy, as required by the "NEC" for use in plenum and riser areas of a building.

SUMMARY OF THE INVENTION

In one aspect, a pellet composition is disclosed, which includes a base resin comprising a polymer and a plurality of electrically conductive elements distributed within the base resin. The polymer can be, for example, a fluoropolymer, a polyolefin, or combinations thereof. At least some of the electrically conductive elements can be formed at least partially of a metal.

In this embodiment and in other embodiments disclosed herein, the electrically conductive elements can comprise any of metal, metal oxide, or other electrically conductive materials, such as carbon nanotubes, carbon fullerenes, carbon fibers, nickel coated carbon fibers, single or multiwall graphene, or copper fibers, among others. By way of example, in some embodiments, the electrically conductive inclusions include any of silver, aluminum, copper, gold, bronze, tin, zinc, iron, nickel, indium, gallium, or stainless steel. In some embodiments, the electrically conductive inclusions can include metal alloys, such as tin alloys, gallium alloys, or zinc alloys. In other embodiments, the electrically conductive inclusions can include metal oxides, such as copper oxide, bronze oxide, tin oxide, zinc oxide, zinc-doped indium oxide, indium tin oxide, nickel oxide, or aluminum oxide. In some embodiments, some of the electrically conductive inclusions are formed of one material while others are formed of another material. Further, in some embodiments, the electrically conductive inclusion are formed of metals and are substantially free of any metal oxides.

In some embodiments, the at least one base polymer, e.g., fluoropolymer, polyolefin, or combinations thereof, in the pellet composition comprises at least about 50% by weight of the pellet composition, at least about 60% by weight of the pellet composition, at least about 70% by weight of the pellet composition, at least about 75% by weight of the pellet composition, at least about 80% by weight of the pellet composition, at least about 85% by weight of the pellet composition, at least about 90% by weight of the pellet composition, or at least about 95% by weight of the pellet composition.

In some embodiments, a weight ratio of the conductive elements to the one or more fluoropolymers or polyolefins can be in a range of about 1% to about 30%. In some embodiments the electrically conductive elements comprise at least about 5% by weight of the pellet composition, at least about 7% by weight of the pellet composition, at least about 10% by weight of the pellet composition, at least about 15% by weight of the pellet composition, at least about 20% by weight of the pellet composition, or at least about 25% by weight of the pellet composition.

In some embodiments, the electrically conductive elements can also have a plurality of different shapes. For example, a first plurality of the conductive elements can have needle-like shapes and a second plurality of the conductive elements can have flake-like shapes (e.g., rectangular shapes).

In some embodiments, the at least one base polymer, e.g., fluoropolymer, polyolefin, or combinations thereof, can be melt-processable at an elevated temperature. For example, the at least one base fluoropolymer can be melt-processable at an elevated temperature of at least about 600° F.

In some embodiments, the at least one base polymer can be a polyolefin or a fluoropolymer. The fluoropolymer can be a perfluoropolymer, for example, a perfluoropolymer having a melting temperature at least about 600° F. For example, the perfluoropolymer can be any of FEP (fluorinated ethylene propylene), MFA (polytetrafluoroethylene-perfluoromethylvinylether) and PFA (perfluoroalkoxy).

In some embodiments, at least some of the conductive elements can be formed of a metal. In some embodiments, the metal can include, without limitation, any of silver, aluminum, copper, gold, bronze, tin, zinc, iron, nickel, indium, gallium, and stainless steel. In some embodiments, at least some of the conductive elements can be formed of a metal oxide. In some embodiments, the metal oxide can include, without limitation, any of copper oxide, bronze oxide, tin oxide, zinc oxide, zinc-doped indium oxide, indium tin oxide, nickel oxide, and aluminum oxide.

In some embodiments, the conductive elements can include a plurality of metallic particles having an average particle size in a range of about 10 microns to about 6000 microns. For example, the conductive elements can include a plurality of fibrils.

In another aspect, a foamable composition is disclosed, which comprises at least one base fluoropolymer or polyolefin, a plurality of electrically conductive elements distributed within the at least one base fluoropolymer or polyolefin, and a chemical foaming agent distributed within the at least one base fluoropolymer or polyolefin. In some embodiments, at least a portion of the electrically conductive elements is formed of a metal. In some embodiments, the electrically conductive elements have a plurality of different shapes. For example, a first plurality of the conductive elements have needle-like shapes and a second plurality of the conductive elements have flake-like shapes, e.g., rectangular shapes. In some embodiments, a first plurality of the conductive elements have a shape primarily configured to reflect electromagnetic radiation in a range of about 1 MHz to about 40 GHz. In some embodiments, a second plurality of the conductive elements have a shape primarily configured to dissipate electromagnetic radiation in range of about 1 MHz to about 40 GHz.

In some embodiments of the above foamable composition having a chemical foaming agent, the at least one base fluoropolymer or polyolefin comprises at least about 50% by weight, or at least about 60% by weight, or at least about 70% by weight, or at least about 75% by weight, or at least about 80% by weight, or at least about 85% by weight, or at least about 90% by weight, or at least about 95% by weight of the foamable composition. In some embodiments, the electrically conductive elements comprise at least about 5% by weight, or at least about 7% by weight, or at least about 10% by weight, or at least about 15% by weight, or at least about 20% by weight, or at least about 25% by weight of the foamable composition.

In some embodiments, in the above foamable composition, the at least one base polymer can be a polyolefin or a fluoropolymer. By way of example, the fluoropolymer can include a perfluoropolymer, e.g., FEP, MFA and PFA. In some embodiments, the foamable composition can include a perfluoropolymer that is melt-processable at an elevated temperature, e.g., at an elevated temperature of at least about 600° F.

In some embodiments, the chemical foaming agent comprises at least about 2% by weight of the foamable composition. In some embodiments, the chemical foaming agent comprises at least about 3%, or at least about 4%, or at least about 5%, or at least about 10%, or at least about 15% by weight of the foamable composition.

In some embodiments, wherein the chemical foaming agent comprises talc.

In some embodiments, in the above foamable composition having a chemical foaming agent, a weight ratio of the conductive elements to the at least one base fluoropolymer or polyolefin is in a range of about 1 percent to about 30 percent, e.g., in a range of about 1 percent to about 20 percent, or in a range of about 1 percent to about 10 percent.

In a related aspect, a separator for use in a telecommunications cable is disclosed, which comprises a plurality of polymeric fibers assembled as a non-woven fabric, and a plurality of electrically conductive elements distributed within the non-woven fabric. In some embodiments, the electrically conductive elements comprise at least about 5% by weight, or at least about 7% by weight, or at least about 10% by weight, or at least about 15% by weight, or at least about 20% by weight, or by at least about 25% by weight of the separator.

In some embodiments, the polymeric fibers are formed of a fluoropolymer, polyolefin, or combinations thereof. In some embodiments, the fluoropolymer can comprise a perfluoropolymer. In some embodiments, the perfluoropolymer has a melting temperature of at least about 600° F. By way of example, the perfluoropolymer comprises any of FEP, MFA and PFA.

In some embodiments, the electrically conductive elements comprise a plurality of fibrils. In some embodiments, the fibrils include a metal. In some embodiments, the metal comprises any of silver, aluminum, copper, gold, bronze, tin, zinc, iron, nickel, indium, gallium, and stainless steel. In some embodiments, the fibrils include a metal oxide. In some embodiments, the metal oxide comprises any of copper oxide, bronze oxide, tin oxide, zinc oxide, zinc-doped indium oxide, indium tin oxide, nickel oxide, and aluminum oxide.

In some embodiments, the separator includes electrically conductive elements having a plurality of different shapes. For example, a first plurality of the conductive elements can have a needle-like shape and a second plurality of the conductive elements can have a flake-like shape. In some embodiments, the separator includes a first plurality of conductive elements having a shape configured to primarily reflect electromagnetic radiation in a range of about 1 MHz to about 40 GHz and a second plurality of conductive elements having a shape configured to primarily dissipate electromagnetic radiation in a range of about 1 MHz to about 40 GHz.

In some embodiments, the conductive elements comprise a plurality of particles having an average size in a range of about 10 microns to about 6000 microns, e.g., in a range of about 10 microns to about 50 microns, or in a range of about 50 microns to about 500 microns, or in a range of about 500 microns to about 1000 microns.

In some embodiments, the above separator exhibits a DC conductivity along an axial direction in a range of about $1\times10^3$ Siemens/meter to about $3.5\times10^7$ Siemens/meter. In some embodiments, the above separator exhibits a sheet resistance in a range of about $1\times10^{-5}$ ohms per square to about $1\times10^5$ ohms per square.

Communications Cable

In further aspects, a communications cable is disclosed, which comprises at least a pair of insulated twisted conductors, and a non-woven tape wrapped around the twisted pair of conductors, wherein the non-woven tape comprises a polymer and a plurality of electrically conductive elements distributed therein for electromagnetically shielding the twisted pair. The polymer can be, for example, a fluoropolymer, a polyolefin, or combinations thereof.

In some embodiments, the non-woven tape is not adapted to be electrically grounded. In some embodiments, the non-woven tape comprises a plurality of polymeric fibers. In some embodiments, the non-woven tape exhibits a DC electrical conductivity along an axial direction in a range of about $1\times10^3$ Siemens/meter to about $3.5\times10^7$ Siemens/meter. In some embodiments, the non-woven tape exhibits a sheet resistance in a range of about $1\times10^{-5}$ ohms per square to about $1\times10^5$ ohms per square.

In some embodiments, at least a portion of the electrically conductive elements is formed of a metal. The metal can include, without limitation, any of silver, aluminum, copper, gold, bronze, tin, zinc, iron, nickel, indium, gallium, and stainless steel.

In some embodiments, at least a portion of the electrically conductive elements is formed of a metal oxide. The metal oxide can include, without limitation, any of copper oxide, bronze oxide, tin oxide, zinc oxide, zinc-doped indium oxide, indium tin oxide, nickel oxide, and aluminum oxide.

In some embodiments, the non-woven tape includes electrically conductive elements having a plurality of different shapes. For example, a first plurality of the conductive elements can have a needle-like shape and a second plurality of the conductive elements can have a flake-like shape. In some embodiments, the non-woven tape includes a first plurality of conductive elements have a shape configured to primarily reflect electromagnetic radiation in a range of about 1 MHz to about 40 GHz and a second plurality of conductive elements having a shape configured to primarily dissipate electromagnetic radiation in a range of about 1 MHz to about 40 GHz.

In some embodiments, the communications cable is an unshielded cable. In some other embodiments, the cable is a shielded cable.

In some embodiments, the communications cable further comprises a jacket that at least partially surrounds the non-woven tape and the twisted pair of conductors. In some embodiments, the jacket can provide shielding of the electromagnetic radiation. By way of example, the jacket can provide shielding of the electromagnetic radiation at wavelengths in a range of about 1 MHz to about 40 GHz.

Cable Jacket

In further aspects, a jacket for a cable is disclosed, which comprises a polymeric shell extending from a proximal end to a distal end and adapted for housing one or more conductors, and an electrically conductive layer that is embedded in the polymeric shell. In some embodiments, the electrically conductive layer is adapted to provide electromagnetic shielding of the one or more conductors.

In some embodiments, the conductors housed within the polymeric shell are adapted for transmitting digital data.

In some embodiments, the electrically conductive layer embedded in the polymeric shell is formed of a metal. In some embodiments, the metal includes, without limitation, any of silver, aluminum, copper, gold, bronze, tin, zinc, iron, nickel, indium, gallium, and stainless steel.

In some embodiments, the electrically conductive layer comprises a continuous layer. In some embodiments, the electrically conductive layer comprises a checkered layer.

In some embodiments, the polymeric shell comprises a polymer. The polymer can be, for example, a fluoropolymer, a polyolefin, or combinations thereof. By way of example, the fluoropolymer can be a perfluoropolymer, such as FEP, MFA or PFA.

In further aspects, a jacket for a cable is disclosed, which comprises a polymeric shell extending from a proximal end to a distal end and adapted for housing one or more conductors, and a plurality of electrically conductive elements distributed within the shell. In some embodiments, the electrically conductive elements have a plurality of different shapes, e.g., some of them can have a needle-like shape and some of the others a flake-like shape.

Separators with Conductive Element

In further aspects, a separator for use in a telecommunication cable is disclosed, which comprises a polymeric preformed elongate support element extending from a proximal end to a distal end and having at least one channel adapted for receiving a plurality of conductors, wherein the elongate support element comprises at least one base polymer and a plurality of electrically conductive elements distributed in the at least one fluoropolymer. The polymer can be, for example, a fluoropolymer, a polyolefin, or combinations thereof.

In some embodiments, at least some of the electrically conductive elements are formed at least partially of a metal. In some embodiments, the electrically conductive elements have a plurality of different shapes. For example, in some embodiments, a first plurality of the conductive elements have needle-like shapes and a second plurality of the conductive elements have flake-like shapes (e.g., rectangular shapes). In some embodiments, a first plurality of the conductive elements have a shape primarily configured to reflect electromagnetic radiation in a range of about 1 MHz to about 40 GHz and a second plurality of the conductive elements have a shape primarily configured to dissipate electromagnetic radiation in a range of about 1 MHz to about 40 GHz.

In some embodiments, the separator exhibits a DC electrical conductivity along an axial direction in a range of about $1\times10^3$ Siemens/meter to about $3.5\times10^7$ Siemens/meter. In some embodiments, the separator exhibits a sheet resistance in a range of about $1\times10^{-5}$ ohms per square to about $1\times10^5$ ohms per square.

In some embodiments, a weight ratio of the conductive elements to the one or more polymers in the above separator is in a range of about 1 percent to about 30 percent.

In some embodiments, the at least one base polymer, e.g., fluoropolymer, polyolefin, or combinations thereof, comprises at least about 50% by weight, or at least about 60% by weight, or at least about 60%, or at least about 70%, or at least about 75%, or at least about 80%, or at least about 85%, or at least about 90%, or at least about 95% of the separator.

In some embodiments, the electrically conductive elements comprise at least about 5% by weight, or at least about 7% by weight, or at least about 10% by weight, or at least about 15% by weight, or at least about 20% by weight, or at least about 25% by weight of the separator.

In further aspect, a separator for use in a cable is disclosed, which comprises a polymeric structure axially extending from a proximal end to a distal end and configured to provide at least two channels each of which is adapted for receiving one or more conductors. An electrically conductive element is embedded in the polymeric structure to provide shielding between conductors disposed in the at least two channels.

In further aspects, a separator for use in a cable is disclosed, which comprises a polymeric structure axially extending from a proximal end to a distal end and configured to provide at least two channels each of which is adapted for receiving one or more conductors, and an electrically conductive layer formed on at least a portion of an outer surface of the polymeric structure. In some embodiments, the electrically conductive layer is formed by a process of electroless plating. In some embodiments, the electrically conductive layer comprises a continuous layer while in other embodiments, the electrically conductive layer comprises a checkered layer.

Further understanding of various aspects of the invention can be achieved by reference to the following detailed description in conjunction with the associated drawings.

BRIEF DESCRIPTION OF DRAWINGS

FIG. 2B schematically depicts a cross-sectional view of the separator of FIG. 2A taken along line A-A;

FIG. 3A schematically depicts a needle-like conductive inclusion having an elongated shape suitable for use in some implementations of the separator of FIGS. 2A and 2B;

FIG. 3B schematically depicts a flake-like conductive inclusion having a pancake-like shape suitable for use in some implementations of the separator of FIGS. 2A and 2B;

FIG. 6A schematically depicts an unshielded cable in accordance with an embodiment of the invention;

FIG. 6B schematically depicts an unshielded cable in accordance with an embodiment of the invention;

FIG. 7 is a flow chart of an exemplary method of manufacturing a cellular article, such as a separator, according to an embodiment of the invention;

DETAILED DESCRIPTION OF THE INVENTION

Figure 1:
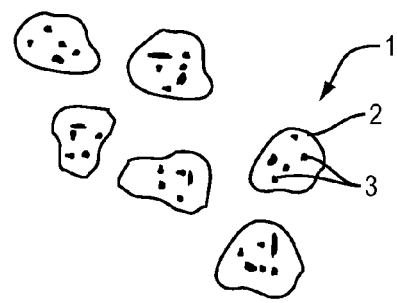
FIG. 1 schematically depicts a plurality of pellets according to an embodiment of the invention.

Certain exemplary embodiments will now be described to provide an overall understanding of the principles of the structure, function, manufacture, and use of the compositions, devices, and methods disclosed herein. One or more examples of these embodiments are illustrated in the accompanying drawings. Those skilled in the art will understand that the systems, devices and methods specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present invention.

So that the invention may more readily be understood, certain terms are first defined.

As used herein, the terms "about" or "approximately" for any numerical values or ranges indicate a suitable dimensional tolerance that allows the composition, part, or collection of elements to function for its intended purpose as described herein. These terms indicate a ±10% variation about a central value.

The term "non-woven fabric" is used herein consistent with its common usage in the art to refer to a material, such as sheet or web structure, made from fibers that are bonded together by chemical, mechanical, heat of solvent treatment (e.g., by entangling the fibers), which are neither woven or knitted.

The term "fibril" as used herein refers to a small slender filament having a length equal or less than about 200 microns and an aspect ratio defined as a ratio of length to width that is equal to or greater than about 100.

The term "fluoropolymer" is used herein consistent with its common usage in the art to refer a polymer having at least one monomer that includes at least one fluorine atom.

The term "per(halo)polymer" is used herein consistent with its common usage in the art to refer to a fluoropolymer that includes monomers in which substantially all hydrogen atoms have been replaced with halogen atoms (e.g., fluorine, chlorine or bromine atoms).

The term "perfluoropolymer" is used herein consistent with its common usage in the art to refer to a fluoropolymer in which substantially all hydrogen atoms have been replaced with fluorine atoms.

The term "electrically conductive material" as used herein refers to a material that exhibits an electrical surface resistivity less than about 50 ohms per square or a volume resistivity less than about 40 ohms-cm.

The term "inclusion" as used herein refers to a material that is at least partially contained within another material.

The term "needle-like" as used herein refers to the art recognized use of the term for a shape having a high aspect ratio, e.g., an aspect ratio greater than about 75.

The term "nucleating agent" as used herein refers to a material that can act as a nucleation site that facilitates foaming.

The term "cross-talk" is used herein consistent with its common usage in the art to refer to electromagnetic interference between conductors, cables, or other electronic circuit elements.

The present application relates generally to compositions, methods and devices for providing shielding of communications cables. For example, the various compositions, methods and devices of the invention can be utilized to reduce or eliminate cross-talk between conductors within a cable or alien cross-talk between cables. As discussed in more detail below, in some aspects of the invention various electrically conductive elements or electrically conductive materials can be blended with polymeric materials to generate pellets, separators (including pre-formed and non-woven separators), or other structures. Various aspects of the invention are described in more detail in the following subsections:

Polymer Compositions

In one aspect, the present invention provides polymeric compositions, e.g., polymeric pellets, that include a polymer, e.g., a thermoplastic polymer, and a plurality of electrically conductive elements that are dispersed within the polymer. In one embodiment, various electrically conductive elements can be blended within a polymer to form the polymeric compositions.

FIG. 1 schematically depicts a polymeric composition 1, e.g. a pellet, according to an embodiment of the invention that includes a polymer base resin 2 in which a plurality of electrically conductive inclusions 3 are dispersed. In some embodiments, the polymer base resin includes at least about 50 weight percent of the composition. For example, the polymer base resin can include about 50 to about 95 weight percent of the composition, or about 60 to about 85 weight percent, or about 60 weight percent to about 80 weight percent, or about 60 weight percent to about 75 weight percent, of the polymeric composition.

In some embodiments, the electrically conductive inclusions 3 can include about 1 weight percent to about 30 weight percent, or about 5 weight percent to about 20 weight percent, or about 5 weight percent to about 15 weight percent, or about 5 weight percent to about 10 weight percent of the polymeric composition.

Any suitable polymer can be used to as the polymer base for forming the polymeric composition 1. In some embodiments, melt-processable polymers such as polyolefins, fluoropolymers, or combinations thereof can be used. For example, a variety of fluoropolymers can be employed as the base polymer. In some embodiments, the base polymer can include one or more perfluoropolymers. By way of example, in some embodiments, the base polymer can be any of MFA (polytetrafluoroethylene-perfluoromethylvinylether), FEP (fluorinated ethylene propylene), PFA (perfluoroalkoxy), PVF (polyvinyl fluoride), PTFE (polytetrafluoroethylene), ETFE (ethylene tetrafluoroethylene or (poly(ethylene-co-tetrafluoroethylene)), ECTFE (ethylene chlorotrifluoroethlyene), PVDF (polyvinylidene fluoride).

In some embodiments, the electrically conductive inclusions 3 can comprise any of metal, metal oxide, or other electrically conductive materials, such as carbon nanotubes carbon fullerenes, carbon fibers, nickel coated carbon fibers, single or multi-wall graphene, or copper fibers. By way of example, in some embodiments the electrically conductive inclusions 3 include any of silver, aluminum, copper, gold, bronze, tin, zinc, iron, nickel, indium, gallium, or stainless steel. In some embodiments the electrically conductive inclusions 3 can include metal alloys, such as, for example, tin alloys, gallium alloys, or zinc alloys. In other embodiments, the electrically conductive inclusions can include metal oxides, such as, for example, copper oxide, bronze oxide, tin oxide, zinc oxide, zinc-doped indium oxide, indium tin oxide, nickel oxide, or aluminum oxide. In some embodiments, some of the electrically conductive inclusions are formed of one material while others are formed of another material. Further, in some embodiments, the electrically conductive inclusion are formed of metals and are substantially free of any metal oxides.

The electrically conductive inclusions 3 can have a variety of shapes. For example, in some embodiments, the electrically conductive inclusions are in the form of discrete particles having a variety of geometrical shapes. For example, the electrically conductive inclusions can comprise particles having any of spherical, needle-like, or flake-like shapes. In some other embodiments, the electrically conductive inclusion 3 are in the form of agglomerates of an electrically conductive material without a defined geometrical shape.

The electrically conductive inclusions can have a variety of sizes and aspect ratios. By way of example, the electrically conductive inclusions can include needle-like particles having an aspect ratio in a range of about 10 to about 1000. In some embodiments, the electrically conductive inclusions can have a maximum size in a range of about 10 microns to about 6000 microns, or in a range of about 600 microns to about 6000 microns, or in a range of about 10 microns to about 600 microns. By of example, the electrically conductive inclusions can include needle-like particles having a length in a range of about 10 microns to about 6000 microns or in a range of about 600 microns to about 6000 microns, or in a range of about 10 microns to about 600 microns. Alternatively or in addition, the electrically conductive inclusions can include spherical particles having a diameter in a range of about 10 microns to about 6000 microns, or in a range of about 600 microns to about 6000 microns, or in a range of about 10 microns to about 600 microns. In other embodiments, the electrically conductive inclusions can include flake-like particles having a maximum cross-sectional dimension in a range of about 10 microns to about 6000 microns, or in a range of about 600 microns to about 6000 microns, or in a range of about 10 microns to about 600 microns.

In some embodiments, the electrically conductive inclusions can include particles of different shapes. For example, the electrically conductive inclusions can include particles having two different shapes. In some such embodiments, one type of the particles are particularly suitable for reflecting electromagnetic radiation incident thereon, e.g., electromagnetic radiation having a frequency in a range of about 1 MHz to about 40 GHz or in a range of about 1 MHz to about 10 GHz, or in a range of about 1 MHz to about 2 GHz, or in a range of about 1 MHz to about 1.5 GHz, and the other type of particles are particularly suitable in dissipating (e.g., via heat generation or eddy current generation) the electromagnetic radiation incident thereon, e.g., electromagnetic radiation having a frequency in a range of about 1 MHz to about 40 GHz or in a range, of about 1 MHz to about 10 GHz, or in a range of about 1 MHz to about 2 GHz, or in a range of about 1 MHz to about 1.5 GHz.

For example, in some embodiments, the polymeric composition 1 can include a plurality of needle-like metallic particles and a plurality of flake-like metallic particles. In some such embodiments, the needle-like metallic particles can primarily reflect the incident electromagnetic radiation having one or more frequencies in a range of about 1 MHz to about 10 GHz and the flake-like metallic particles can primarily dissipate (e.g., via absorption) the incident electromagnetic radiation having frequencies in a range of about 1 MHz to about 10 GHz. In some such embodiments, the fraction of particles having needle-like shape relative to those having a flake-like shape, or vice versa, can be about, e.g., 50/50, 40/60, 30/70, 20/80, or 10/90.

In another aspect, a polymeric composition is disclosed that includes a base polymer, a plurality of electrically conductive elements dispersed in the polymer, and at least one chemical foaming agent that is also dispersed in the polymer.

In some embodiments, the base polymer can comprise at least about 50 weight percent, or at least about 60 weight percent, or at least about 70 weight percent, or at least about 80 weight percent, or at least about 90 weight percent or at least about 95 weight percent of the composition. The electrically conductive inclusions can in turn comprise at least about 1 weight percent, or at least about 2 weight percent, or at least about 3 weight percent, or at least about 4 weight percent, or at least about 5 weight percent, or at least about 6 weight percent, or at least about 7 weight percent, or at least about 8 weight percent, or at least about 9 weight percent, or at least about 10 weight percent, or at least about 15 weight percent, or at least about 20 weight percent of the composition. For example, the electrically conductive inclusions can comprise about 1 weight percent to about 20 weight percent of the composition. Further, the chemical foaming agent can comprise at least about 1 weight percent, or at least about 2 weight percent, or at least about 3 weight percent, or at least about 4 weight percent, or at least about 5 weight percent, or at least about 6 weight percent, or at least about 7 weight percent, or at least about 8 weight percent, or at least about 9 weight percent, or at least about 10 weight percent, or at least about 15 weight percent, or at least about 20 weight percent, or at least about 30 weight percent, of the composition.

A variety of polymers and metal inclusions, such as those discussed above, can be utilized in the above polymeric compositions having a chemical foaming agent. Further, a variety of chemical foaming agents can be employed. By way of example, the chemical foaming agent can include, without limitation, any of magnesium carbonate, calcium carbonate, talc, MgSiOH, sodium bicarbonate, members of the azo family of compounds, azodicarbonamide, or other known chemical foaming agents and combinations thereof, Further, in some embodiments, in addition to or instead of, the chemical foaming agent, the above polymeric compositions of the invention can include one or more nucleating agents. In some embodiments, the nucleating agent can comprise at least about 1 weight percent, or at least about 2 weight percent, or at least about 3 weight percent, or at least about 4 weight percent, or at least about 5 weight percent, or at least about 6 weight percent, or at least about 7 weight percent, or at least about 8 weight percent, or at least about 9 weight percent, or at least about 10 weight percent, or at least about 15 weight percent, or at least about 20 weight percent, or at least about 30 weight percent, of the composition. A variety of nucleating agents can be employed. For example, in some embodiments, the nucleating agent can be any of boron nitride, titanium dioxide, talc, nanoclays, other known nucleating agents, and combinations thereof. In some embodiments, the chemical foaming agent can also function as a nucleating agent. By way of example, U.S. Pat. No. 7,968,613 titled "Compositions for compounding, extrusion and melt processing of foamable and cellular fluoropolymer," which is herein incorporated by reference in its entirety, teaches that talc can function both as a chemical foaming agent and a nucleating agent when blended in melt-processable polymers, as such polyolefins, fluoropolymers, or perfluoropolymers.

Further, in some embodiments, the metal inclusions themselves can function as nucleating agents for providing nucleating sites for foaming of the above polymeric composition.

A variety of techniques can be employed to form the above polymeric compositions. In some embodiments, a base polymer, e.g., a base fluoropolymer (e.g., PVDF, PVF, ECTFE, or ETFE), or a perfluoropolymer (e.g., FEP, MFA or PFA) can be melted by exposure to an elevated temperature, e.g., a temperature of at least about 600 F, and the electrically conductive inclusions, e.g., metal particles, can be blended in the melted base polymer. Further, in some embodiments, a chemical foaming agent and/or a nucleating agent can also be blended in the melted base polymer. In some embodiments, the blend can then be pelletized. For example, an extruder, e.g., a twin-screw extruder, can be used to melt, blend and pelletize the polymer compositions. The design of the extruder can be such that there is sufficient heat and mechanical energy to fully thermally melt the polymer composition with proper distribution and dispersion during mixing for homogeneity, but yet mild enough to keep the processing temperature of the composition compound below that in which foaming occurs. The composition can be strand extruded and pelletized or alternatively an underwater pelletizing technique may be used.

The above polymeric compositions can be processed to form various articles. Some examples of such articles include, without limitation, woven and non-woven fabrics, pre-formed and tape separators, insulative coating for electrical conductors, among others.

A variety of processing methods can be employed to process the above polymeric compositions to form the above articles. For example, in some embodiments, polymeric pellets according to the teachings of the invention, such as those discussed above, can be extruded to form a variety of articles. For example, in some embodiments, pellets having both metal inclusions and a chemical foaming agent can be extruded to form cellular articles.

In the following sections, a variety of articles that can be formed by using polymeric compositions according to the teachings of the invention are discussed.

Separators

In one aspect, the invention provides separators, e.g., for use in telecommunications cables, that include a plurality of electrically conductive inclusions, e.g., metal particles, that are distributed therein to provide shielding of electromagnetic radiation. In some embodiments such separators can be formed into predefined shapes, e.g., by extrusion via a die. For example, a die with a cross-shaped opening can be used to form an elongated separator that has an elongated cross-shaped form. In other embodiments, the separators can be in the form of flexible tapes.

Figure 2A:
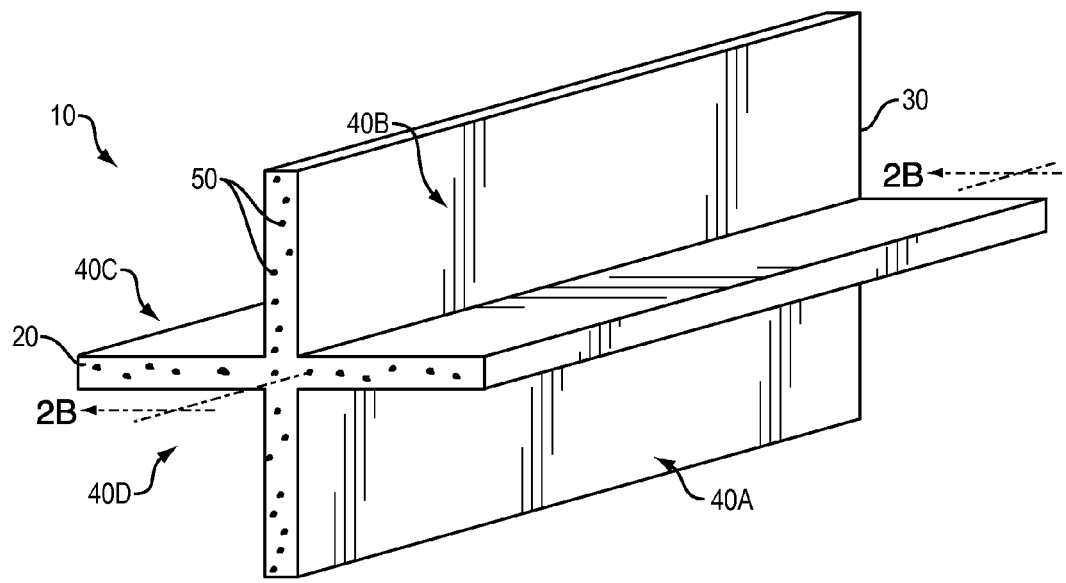
FIG. 2A schematically depicts a separator according to an embodiment of the invention.

By way of example, FIGS. 2A and 2B schematically depict a pre-formed separator 10 according to one embodiment of the invention that has an elongated cross-shaped form, which extends from a proximal end 20 to a distal end 30. The separator 10 provides four elongated channels 40A, 40B, 40C, 40D, in each of which a conductor, e.g., a twisted-pair wire, can be disposed. A plurality of metal inclusions 50 are distributed throughout the separator 10. While in some embodiments the metal inclusions 50 are distributed substantially uniformly within the body of the separator 10, e.g., as depicted in the cross-sectional view of FIG. 2B, in other embodiments, the spatial distribution of the metal inclusions can be non-uniform. By way of example, in some embodiments, the density of the metal inclusions 50 in the proximity of the channel walls of the separator can be greater than a respective density in the central portion of the separator. As discussed in more detail below, the metal inclusions facilitate shielding the conductors disposed in the channels from one another, thereby minimizing and preferably eliminating cross-talk between these conductors. In many embodiments, the separator 10 is particularly effective in lowering the cross-talk in a frequency range of about 1 MHz to about 40 GHz, or in a range of about 1 MHz to about 10 GHz, or in a range of about 1 MHz to about 2 GHz, or in a range of about 1 MHz to about 1.5 GHz between the conductors disposed in neighboring channels. In other embodiments, the separator 10 is particularly effective in lowering cross-talk in a frequency range of about 500 MHz to about 1 GHz, in a range of about 500 MHz to about 10 GHz, in a range of about 1 MHz to about 40 GHz, in a range of about 1 MHz to about 10 GHz, in a range of about 1 MHz to about 2 GHz, or in a range of about 1 MHz to about 1.5 GHz. These frequency ranges are particularly useful for separators in cables used for high speed transmission of information. For example, to transmit information through a cable at a higher bit rates, a higher bandwidth is required which, in turn, requires transmission of signals at higher frequencies. Current data cabling performance requirements are defined by ANSI-TIA-568-C.2. One performance requirement for communications cables is known as "attenuation to crosstalk ratio, far end" (ACRF). ACRF is a measure of how much signal is received at the far end of a given cable as a ratio of the interfering signal induced by adjacent conductor pairs in the cable. Table 1, below, lists the minimum ACRF for Category 5e, Category 6, and Category 6A cables.

TABLE 1

| Cable Type | Highest Frequency Defined (MHz) | Minimum ACRF (dB) |
| --- | --- | --- |
| Category 5e | 100 | 23.8 |
| Category 6 | 250 | 19.8 |
| Category 6A | 500 | 13.8 |

Improved reduction of cross talk between conductors in a cable can enable data transmission at higher frequencies than those listed in Table 1. For example, cables the incorporate the separators, tapes, and other materials according to embodiments of the invention can reduce cross talk at a given frequency, raising ACRF and thereby enabling high performance cable properties.

In this exemplary embodiment, the separator 10 is formed of a polymeric material in which a plurality of metal inclusions 50, e.g., metallic particles, are distributed. By way of example, in some implementations, the separator 10 comprises a polyolefin, a fluoropolymer (e.g., PVDF, PVF, ECTFE, or ETFE), or a perfluoropolymer (e.g., FEP, MFA or PFA), and the metal inclusions include a metal such as copper, silver, gold, aluminum, bronze, tin, alloys of tin, zinc, alloys of zinc, iron, nickel, indium, alloys of indium, gallium, alloys of gallium, or stainless steel. In other embodiments, the inclusions include of metal oxides, such as, for example, copper oxide, bronze oxide, tin oxide, zinc oxide, zinc-doped indium oxide, indium tin oxide, nickel oxide, or aluminum oxide. In some implementations, the separator comprises two or more different polymers, such as two or more different polyolefins and/or fluoropolymers, e.g., a blend of two of more of FEP, MFA, and PFA. Further, in some cases, the metal inclusions can exhibit a variety of different shapes and/or be formed of different metals.

In some embodiments, one type of the metal inclusions primarily reflect electromagnetic radiation within a frequency range (e.g., a frequency range of about 1 MHz to about 10 GHz) incident thereon while the other type of metal inclusions primarily absorb the incident radiation in that frequency range. In this manner, effective shielding of conductors, e.g., twisted-pair wires, housed in the separator can be achieved.

By way of example, in this exemplary embodiment, the metal inclusions 50 can include two types, one of which exhibits a needle-like shape and the other a flat flake-like shape. By way of illustration, FIG. 3A schematically depicts one of the needle-like metal inclusions 50a that exhibits an elongated (needle-like) shape. In some embodiments, the needle-like metal inclusions 50a can have an average length (L) in a range of about 10 microns to about 6000 microns, or in a range of about 10 microns to about 200 microns, or in a range of about 600 microns to about 1000 microns (the average length can be an average of the lengths of an ensemble of needle-like particles distributed within the separator). In some embodiments, the needle-like metal inclusions 50a can exhibit an aspect ratio greater than about 75, or in a range of about 75 to about 200. The aspect ratio can be defined as the ratio of the length of the inclusion relative to a maximum cross-sectional dimension thereof, e.g., a maximum width (W) shown in FIG. 3A

FIG. 3B schematically depicts one of the flake-like metal inclusions 50b depicting a pancake-like shape that can be characterized by a maximum cross-sectional dimension (W) and a thickness (T). In some embodiments, the flake-like metal inclusions 70 distributed throughout the separator 10 can exhibit an average maximum cross-sectional dimension in a range of about 10 microns to about 6000 microns, or in a range of about 600 microns to about 6000 microns, or in a range of about 10 microns to about 600 microns and an average length in a range of about 10 microns to about 6000 microns, or in a range of about 600 microns to about 6000 microns, or in a range of about 10 microns to about 600 microns.

In some embodiments, the metal inclusions 50 can comprise a volume fraction of the separator 10 in a range of about 1% to about 40%, or in a range of about 2% to about 30%, or in a range of about 3% to about 20%, or in a range of about 4% to about 15%, or in a range of about 5% to about 10%.

In some embodiments, the polymer, e.g., fluoropolymer, polyolefin, or combinations thereof, can comprise at least about 30%, or at least about 40%, or at least about 50%, or at least about 60%, or at least about 70%, or at least about 80%, or at least about 85%, or at least about 90%, or at least about 95% of the volume of the separator.

In some embodiments, the metal inclusions 50 can comprise a weight percent of the separator in a range of about 1% to about 30%, or in a range of about 5% to about 20%, or in a range of about 5% to about 15%, or in a range of about 10% to about 15%.

In some embodiments, the polymer, e.g., fluoropolymer, polyolefin, or combinations thereof, can comprise at least about 30 weight percent, or at least about 40 weight percent, or at least about 50 weight percent, or at least about 60 weight percent, or at least about 70 weight percent, or at least about 80 weight percent, or at least about 85 weight percent, or at least about 90 weight percent, or at least about 95 weight percent, of the separator.

Figure 4:
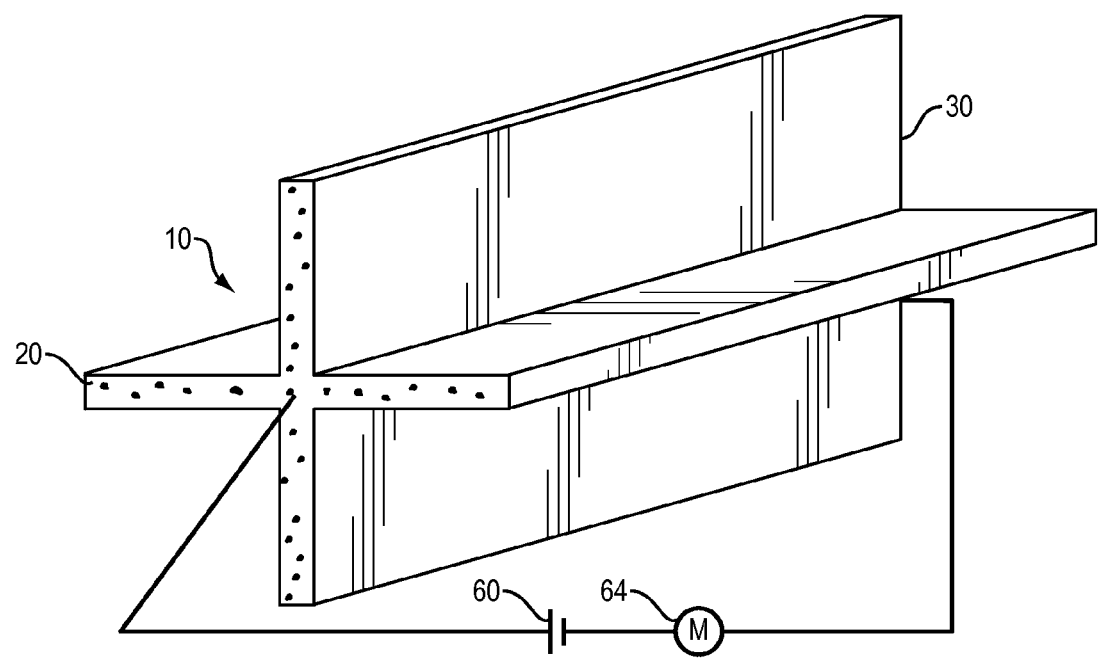
FIG. 4 schematically shows a method for measuring electrical conductivity of a separator according to the teachings of the invention in which a plurality of electrically conductive inclusions are incorporated.

In some embodiments, the separator 10 exhibits an axial DC (direct current) electrical conductivity that is in a range of about $1\times10^3$ Siemens/meter to about $3.5\times10^7$ Siemens/meter Such an axial DC electrical conductivity ($\sigma$) can be measured between the proximal end and the distal end of the separator 10 by applying a DC voltage (V) between the proximal and distal ends of the separator, e.g., by employing a voltage source 60, and measuring the DC current (I) flowing axially (i.e., in a direction from the proximal end to the distal end or vice versa) by using a DC current meter 64, as shown schematically in FIG. 4. Ohm's law can then be utilized to determine the DC electrical conductivity according to the following relation:

$$\sigma = \frac{I}{V} \qquad \text{Eq. 1}$$

wherein,
$\sigma$ denotes electrical conductivity,
V denotes DC voltage applied across the separator,
and I denotes DC current flowing through the separator in response to application of the voltage V.

In some embodiments, the separator 10 exhibits an AC (alternating current) conductivity ($\sigma_{ac}$) (defined as the inverse of AC impedance) in a range of about $1\times10^3$ Siemens/meter to about $3.5\times10^7$ Siemens/meter for frequencies in a range of about 1 MHz to about 40 GHz. The AC conductivity can be measured by applying an AC voltage axially across the separator (e.g., between the proximal end 20 and the distal end 30) and measuring the AC current through the separator 20 by using an AC current meter, e.g., in a manner shown in FIG. 4 with the DC voltage source replaced with an AC voltage source and the DC current meter replaced with an AC current meter. The AC conductivity can then be determined by using the following relation:

$$\sigma_{ac} = \frac{I_{max}}{V_{max}} \qquad \text{Eq. 2}$$

wherein,
$I_{max}$ denotes the maximum of the measured AC current and
$V_{max}$ denotes the maximum of the measured AC voltage.

In some embodiments, the materials used to form the separator 10 can exhibit a sheet resistance in a range of about $1\times10^{-5}$ ohms per square to about $1\times10^5$ ohms per square, or preferably about 10 ohms per square. As one of skill in the art will appreciate, the sheet resistance of a material will change depending on the thickness of the material. For example, sheet resistance (ohms per square) multiplied by the material's thickness in centimeters equals the volume resistivity of the material (ohms-cm). As a result, the volume resistivity needed to achieve a given sheet resistance will depend on the thickness of the material in question. For example, a thicker material will provide the same volume resistivity with a less conductive material as a thinner material that is more conductive. As a more specific example, a tape with a thickness of 0.0254 cm (0.010 inches) can have a volume resistivity of 0.254 ohms-cm and a surface resistance of 10 ohms per square. If the thickness of the tape is reduced to 0.0127 cm (0.005 inches), the volume resistivity is reduced by half to 0.127 ohms-cm to achieve the same surface resistance of 10 ohms per square.

In some embodiments, the materials used to form the separator 10 can have a shielding effectiveness in a range of about 15 dB to about 90 dB, or in a range of about 15 dB to about 50 dB, or in a range of about 50 dB to about 90 dB. Shielding effectiveness can be measured according to ASTM D4935-99: Standard Test Method for Measuring the Electromagnetic Shielding Effectiveness of Planar Materials, the contents of which are incorporated herein by reference.

Figure 5:
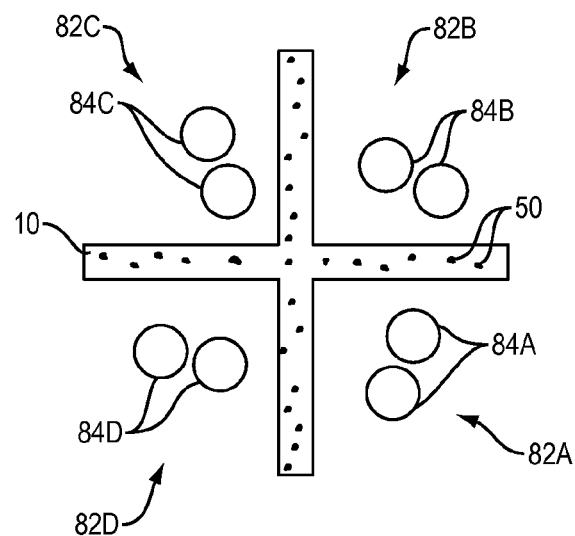
FIG. 5 schematically depicts a separator and a plurality of conductors disposed in longitudinal channels provided by the separator.

As shown schematically in FIG. 5, in use, a plurality of conductors 84A, 84B, 84C, and 84D (herein collectively referred to as conductors 84) can be disposed in the channels 82A, 82B, 82C, 82D provided by the separator 80. The conductors can be, for example, twisted pairs of wires. The separator 10 minimizes, and preferably eliminates, crosstalk between the conductors disposed in different channels. For example, when conductors 84A, 84B, 84C, 84D are used to transmit telecommunications data at rates up to about 100 Gbits/sec, or in a range of about 1 Mbit/sec to about 100 Gbits/sec, or in a range of about 1 Mbit/sec to about 40 Gbits/sec., the metal inclusions 50, e.g., facilitate electromagnetic shielding of the conductors disposed in neighboring channels from one another. The shielding can in turn minimize, and preferably eliminate, the cross-talk between the neighboring conductors at frequencies corresponding to those emitted by the conductors, e.g., frequencies in a range of about 500 MHz to about 1 GHz or a frequencies in a range of about 500 MHz to about 10 GHz.

While the separator 80 has a cross-shaped cross-sectional profile, in other embodiments the separator 80 can have other shapes. Other exemplary embodiments of separators are disclosed in US Publication No. 2010/0206609, filed Apr. 6, 2010, entitled "High Performance Support-Separators for Communications Cables Providing Shielding for Minimizing Alien Crosstalk," US Publication No. 2007/0151745, filed Mar. 2, 2007, entitled "High Performance Support-Separators for Communications Cables," US Publication No. 2008/0066947, filed Jul. 16, 2004, entitled "upport Separators for Communications Cable," and U.S. Pat. No. 7,098,405, filed May 1, 2002, entitled "High Performance Support-Separator for Communications Cables,", the teachings of which are each incorporated herein by reference in their entirety.

While in the above separator 80, the electrically conductive inclusions are formed of a metal, in other embodiments the inclusions 86 can be formed of a metal oxide, such as, for example, copper oxide, bronze oxide, tin oxide, zinc oxide, zinc-doped indium oxide, indium tin oxide, nickel oxide, or aluminum oxide. In other embodiments, the electrically conductive inclusions can be formed of carbon nanotubes, graphene, and/or fullerenes. As known in the art, carbon nanotubes are allotropes of carbon with a cylindrical nanostructure. Nanotubes are members of the fullerene structural family, which also includes the spherical buckyballs, and the ends of a nanotube may be capped with a hemisphere of the buckyball structure.

The separator 80 can be used in a variety of cables, including shielded and unshielded cables. By way of example, FIG. 6A schematically depicts a shielded cable 90 in which the separator 10 is disposed. The shielded cable 90 includes a metal braid, metal tape, or both 92 that surrounds the separator 10 to provide shielding of alien cross-talk. In some cases, in use, the metal braid, metal tape, or both can be grounded. The metal braid, metal tape, or both 92 is turn surrounded by a jacket 93, which can be formed of a polymeric material. In some cases, the jacket can be formed of a low-smoke PVC, halogenated polyolefin, or zero-halogen polyolefin. In some cases, the jacket 93 is formed of a polymer, such as a polyolefin, a fluoropolymer, e.g., FEP, MFA, PFA, ETFE, ECTFE, PVDF, PVF, or combinations thereof.

By way of further illustration, FIG. 6B schematically depicts an unshielded cable 94 that incorporates the separator 10. The cable 94 further includes a jacket 95 that surrounds the separator 10. In some embodiments, the jacket 95 can be in contact with the outermost tips of the separator 10 to provide positional stability. In other embodiments, a gap can exist between the separator and the jacket 95.

The above separator 10, or other pre-formed cellular articles, having a plurality of metal inclusions can be manufactured in a variety of ways. By way of example, with reference to the flow chart of FIG. 7, in one exemplary method of manufacturing the separator 10, a plurality of polymer pellets, e.g, fluoropolymer or polyolefin pellets, in which metal inclusions are incorporated, such as the pellets discussed above, can be melted (step 1) and the molten pellets can be extruded to form the separator 10 (step 2). The resulting separator can be solid or can include a plurality of cells, e.g., a cellular foam. For example, the cellular foam can include cells having an open cell structure, a closed cell structure, or a combination thereof. The average size of the foam cells can vary. In some embodiments the foam cells can have an average size in a range of about 0.0005 inches to about 0.003 inches with an average size of about 0.0008 inches. Further exemplary embodiments of methods of manufacturing separators are disclosed in U.S. application Ser. No. 12/221,280, filed Aug. 1, 2008, entitled "Compositions for Compounding, Extrusion, and Melt Processing of Foamable and Cellular Fluoropolymers," now issued as U.S. Pat. No. 7,968,613 and in U.S. application Ser. No. 12/590,471, filed Nov. 9, 2009, entitled "Compositions, additives, and compounds for melt processable, foamable, and cellular fluoropolymers," now published as U.S. Patent Publication No. 2010/0072644 the teachings of both of which are incorporated herein by reference in their entirety.

Figure 8A:
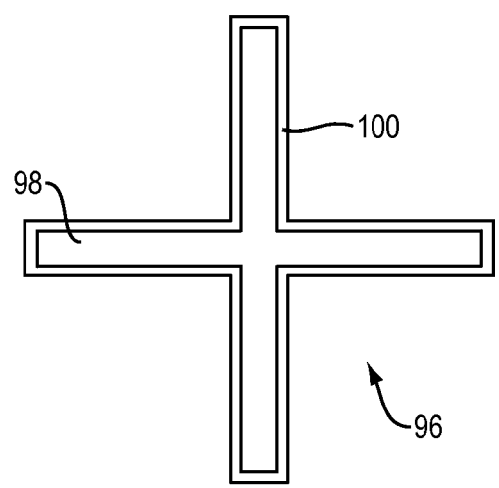
FIG. 8A schematically depicts a separator having a metal coating disposed on an external surface thereof according to an embodiment of the invention.

In some embodiments, rather than or in addition to distributing metal inclusions within a separator, an outer surface of a separator can be coated with an electrically conductive material, e.g. it can be metallized, to provide electromagnetic shielding. By way of example, FIG. 8A schematically depicts an embodiment of such a separator 96, which has a polymeric body portion 98 having a T-shaped cross-sectional profile. A thin metal coating 100 covers an outer surface of the body portion 98 to provide electromagnetic shielding. In some embodiments, a thickness of the metal coating can be, e.g., in a range of about 3 microns to about 12 microns. While in some embodiments, the metal coating has a substantially uniform thickness, in other embodiments, the thickness of the metal coating can exhibit a variation over the surface on which it is deposited. A number of metals can be utilized to form the coating 100. By way of example, the metal coating can be formed of any of copper, silver, aluminum, copper, gold, bronze, tin, zinc, iron, nickel, indium, gallium, or stainless steel. In some embodiments, a plurality of electrically conductive inclusions (e.g., metal inclusions), discussed in more detail above, can be distributed within the polymeric body portion 98.

Figure 8B:
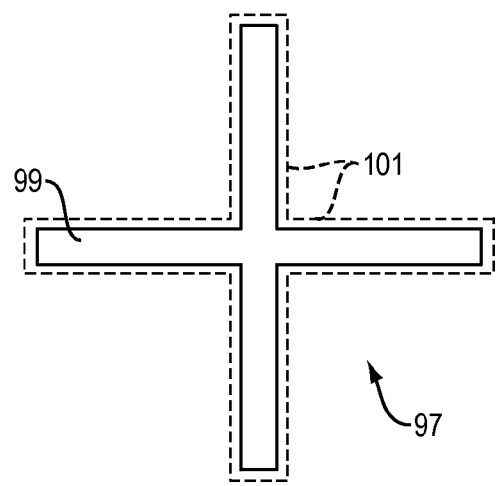
FIG. 8B schematically depicts a separator having a patchwork of metal portions disposed on an external surface thereof according to an embodiment of the invention.

While in this embodiment, the metal coating 100 covers substantially the entire outer surface of the body portion 98, in other embodiments, the metal coating can cover only portions of the outer surface. By way of example, FIG. 8B schematically depicts a separator 97 according to another embodiment having a metal coating that is in the form of a patchwork of metal portions 101 deposited on the outer surface of a polymeric body portion 99 of the separator. Again, the thickness of each metal portion can be, e.g., in a range of about 3 microns to about 12 microns. In some cases, the metal portions cover at least about 30%, or at least about 40%, or at least about 50%, or at least about 60%, or at least about 70%, or at least about 80%, or at least about 90%, or at least about 95% of the surface area of the separator. In some embodiments, a plurality of electrically conductive inclusions, e.g., metal inclusions, can be distributed within the polymeric body portion 99.

The coating of conductive material can be applied using any suitable process known in the art. For example, the coating can be applied using a process of electroless plating. Other processes that can be used to apply the coating of conductive material can includes, for example, electroplating, vacuum deposition, sputter coating, double-side plating, single-side plating. In some embodiments, the coating can be applied as a film or foil bonded or otherwise attached to or disposed on the separator. In other embodiments, the coating can be applied by passing the separator through a metal bath, e.g., a tin, bismuth-tin blend, or indium alloy bath.

Figure 9:
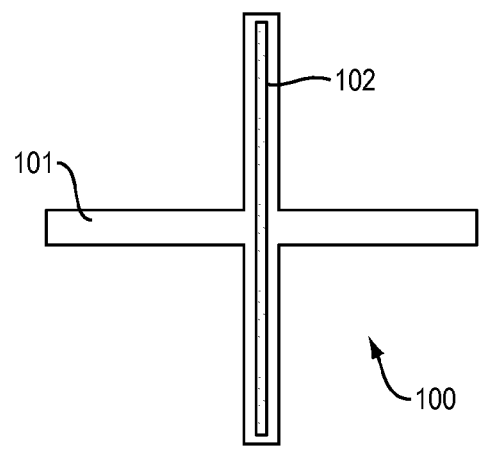
FIG. 9 schematically depicts a separator having an electrically conductive strip disposed therein according to an embodiment of the invention.

FIG. 9 schematically depicts a separator 100 according to another embodiment of the invention that includes a polymeric body portion 102 having a T-shaped cross section which provides 4 channels in which conductors can be disposed. The separator 100 further includes an electrically conductive strip 102 (e.g., a metal strip) that is disposed internally within the body portion 101. In this embodiment, the metal strip extends along the length of the separator from a proximal end to a distal end thereof to provide electromagnetic shielding between conductors (not shown) disposed within the channels formed by the separator. In some embodiments, a thickness of the internal metal strip can be in a range of about 6 microns to about 55 microns.

The above separator 100 can be manufactured in a variety of ways. In one exemplary method of manufacturing the separator 100 the electrically conductive strip 102 can be co-extruded along with a plurality of fluoropolymer or polyolefin pellets to form the separator 100.

Figure 10A:
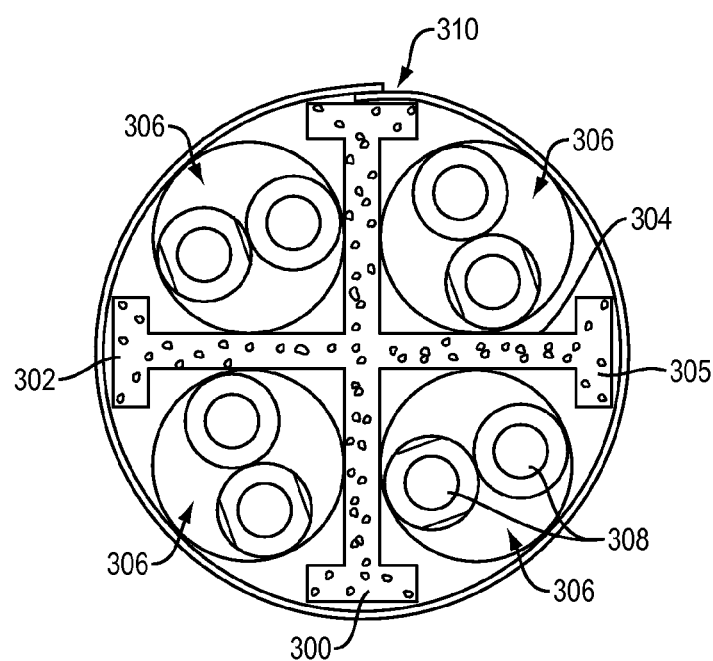
FIG. 10A schematically depicts a cross-sectional end view of a separator having T-shaped flap portions according to an embodiment of the invention.

FIG. 10A schematically depicts a separator 300 according to another embodiment of the invention that includes a body portion 302 having arms 304 that extend outward to T-shaped flap portions 305. The flap portions 305 are shaped to form a plurality of channels 306 in which conductors 308 can be disposed. As discussed above, the separator 300 can be formed of a polymeric material, such as, FEP, PFA, MFA, and any of the other polymers discussed above. Also as discussed above, a plurality of metal inclusions 310, e.g., metallic particles, can be distributed in the polymeric material of the separator 300. In some embodiments, a shielding material 310 can be wrapped around the separator 300. The shielding material 310 can be formed of any material, such as the tape materials discussed in more detail below. In some embodiments, the shielding material can be an aluminum mylar film. For other embodiments, the shielding material can be a multi-layer tape material, as discussed below with respect to FIGS. 13A, 13B, 13C, 13D, or a nonwoven material, as discussed below with respect to FIG. 14.

Figure 10B:
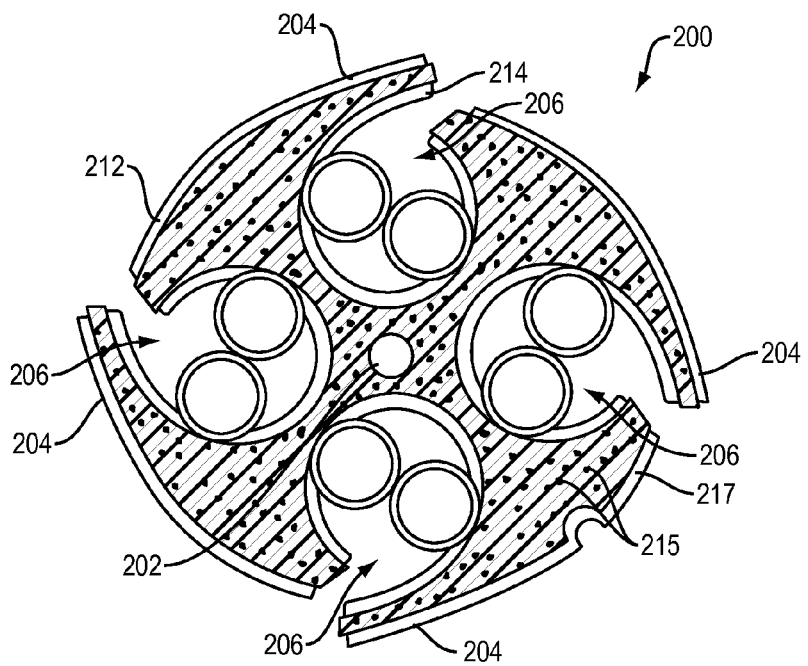
FIG. 10B schematically depicts a cross-sectional end view of a separator having flap portions when the flaps are open according to an embodiment of the invention.
Figure 10C:
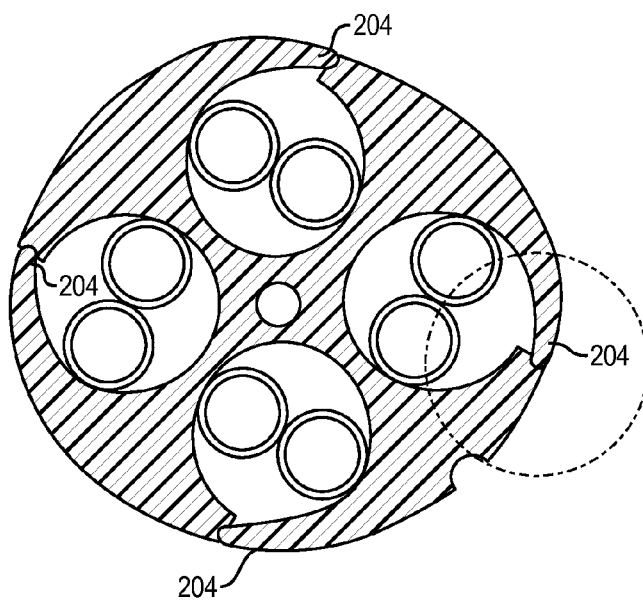
FIG. 10C schematically depicts a cross-sectional end view of a separator having flap portions when the flaps are closed according to an embodiment of the invention.
Figure 10D:
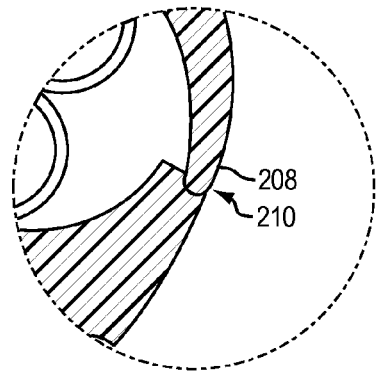
FIG. 10D is an enlarged detail of a portion of the separator depicted in FIG. 10B according to an embodiment of the invention.

FIG. 10B schematically depicts a separator 200 according to another embodiment of the invention that includes an inner central portion 202 and outer flap portions 204. The separator 200 can be formed of a polymeric material, such as, FEP, PFA, MFA, and any of the other polymers discussed above. The flap portions are shaped to form a plurality of channels 206 in which conductors can be disposed. The flap portions 204 can be initially in an open position to allow insertion of electrical conductors, e.g., twisted pair conductors, within the channels 206. The flap portions 204 can then be sealed (e.g., via application of heat and/or pressure) as shown schematically in FIG. 10C. For example, during manufacturing, the flap portion 204 is in the opened position (e.g., as shown in FIG. 10B) and closes as either pressure or heat or both are applied (normally through a circular cavity during extrusion). Optionally, a second heating die may be used to ensure closure of the flap-top after initial extrusion of the separator or cable during manufacture. Another possibility is the use of a simple metal ring placed in a proper location that forces the flap-top down during final separator or cable assembly once the conductors have been properly inserted into the channels. The metal ring may be heated to induce proper closure. Other techniques may also be employed as the manufacturing process will vary based on separator and cable requirements (i.e. number of conductors required, use of grounding wire, alignment within the channels, etc.). As shown in more detail in FIG. 10D, in one embodiment the flap portion 208 can be secured to a recessed portion of one side of an opening of the cavity of the separator 210, and closure occurs when the unsecured, physically free end 208 is adjoined to and adhered with the other end of the outer surface of the channel wall.

Figure 10E:
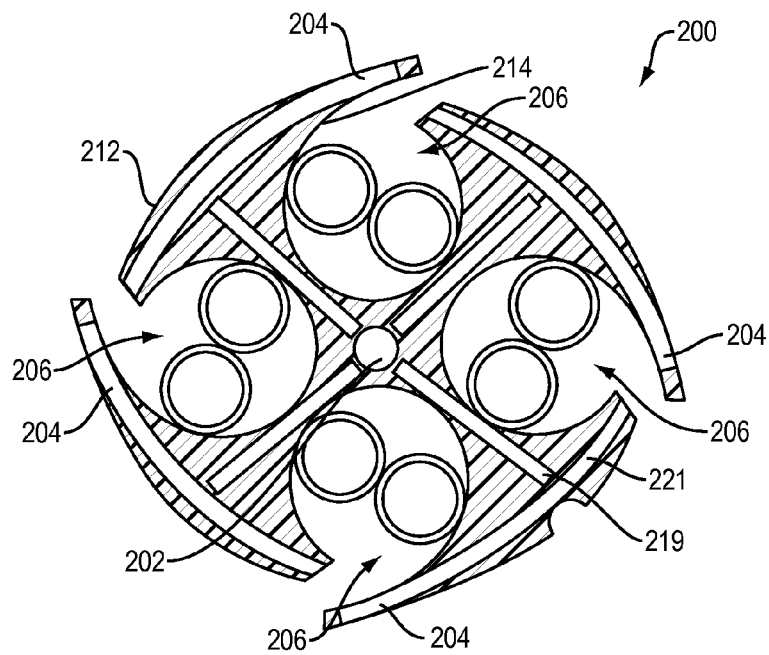
FIG. 10E schematically depicts a cross-sectional end view of a separator having open channels according to an embodiment of the invention.
Figure 10F:
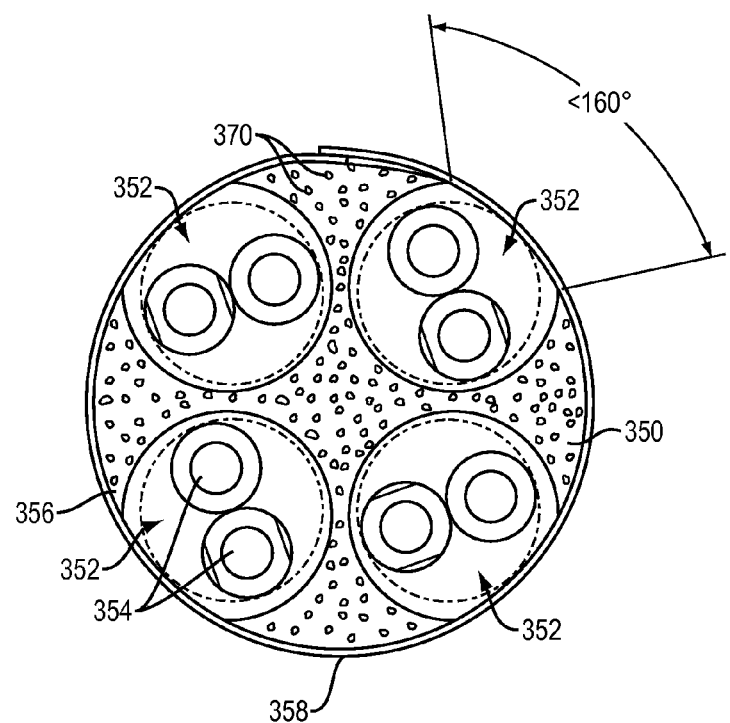
FIG. 10F schematically depicts a cross-sectional end view of a separator having substantially closed channels according to an embodiment of the invention.

FIG. 10E schematically depicts a separator 350 according to another embodiment of the invention that includes substantially open channels 352 in which conductors 354 can be disposed. FIG. 10F schematically depicts a separator 360 according to another embodiment of the invention that includes substantially closed channels 362. For example, the walls of the channels can encircle the channels through an angle of about 200 degrees thereby leaving openings of about 160 degrees, as shown in FIG. 10E. For another example, the walls of the channels can encircle the channels through an angle of about 350 degrees thereby leaving openings of about 10 degrees, as shown in FIG. 10F. In some embodiments, the walls of the channels can encircle the channels through an angle in the range of about 200 degrees to about 350 degrees thereby leaving openings in the range of about 160 degrees to about 10 degrees.

Figure 10G:
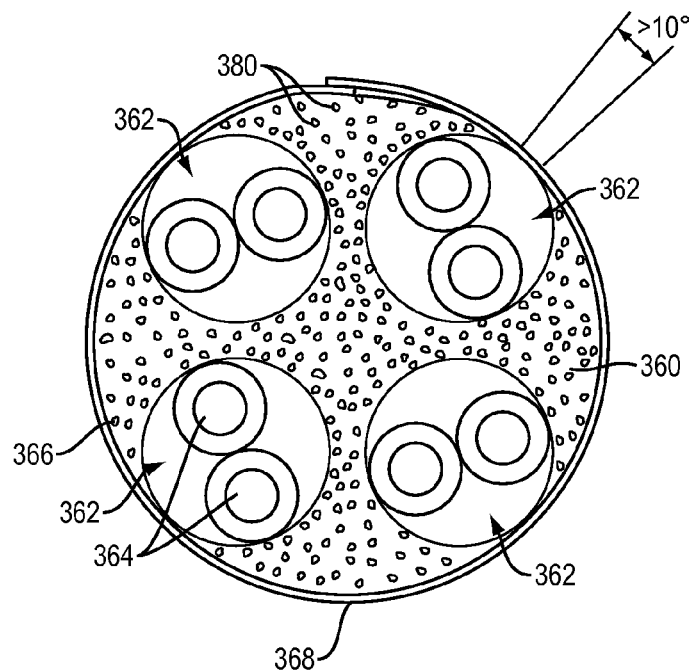
FIG. 10G schematically depicts a cross-sectional end view of a separator having offset arms according to an embodiment of the invention.
Figure 10H:
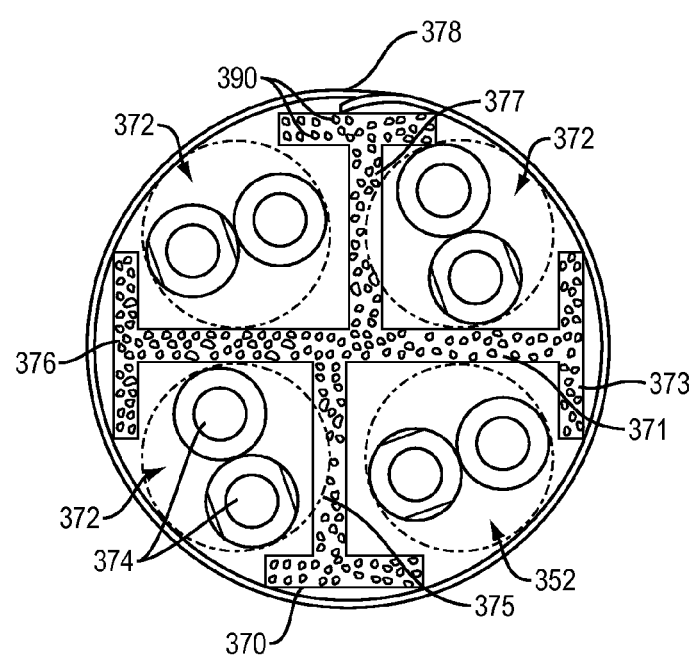

FIG. 10G schematically depicts a separator 370 according to another embodiment of the invention that includes a body portion 371 having arms that extend outward to T-shaped flap portions 373. The flap portions 373 are shaped to form a plurality of channels 372 in which conductors 374 can be disposed. The separator includes at least two opposing arms 375, 377 that are offset from each other relative to the center of the separator 370. In some embodiments, the offset between opposing arms 375, 377 of the separator 370 can reduce interference, e.g., crosstalk, between adjacent twisted pairs of conductors by increasing the spacing between adjacent twisted pairs that match in their twist orientation. For example, the offset between opposing arms 375, 377 of the separator 370 can provide an additional offset between twisted pairs running in adjacent channels 372 of the separator 370. The arms 375, 377 can be offset from the center of the separator by various distances. For example, the arms 375, 377 can be offset from the midpoint of the separator by a distance equal to about half the thickness of the arms 375, 377. In some embodiments, the arms 375, 377 can be offset from the midpoint of the separator by a distance equal to about half the diameter of the conductors 374.

As discussed above, the separators 350, 360, 370 depicted in FIGS. 10E, 10F, and 10G can be formed of a polymeric material, such as, FEP, PFA, MFA, and any of the other polymers discussed above. Further, as discussed above, the separators 350, 360, 370 can be solid or can include a plurality of cells 356, 366, 376, e.g., a cellular foam. For example, the cellular foam can include cells have an open cell structure, a closed cell structure, or a combination thereof. Also as discussed above, a plurality of metal inclusions 370, 380, 390, e.g., metallic particles, can be distributed in the polymeric material of the separator 350, 360, 370. In some embodiments, a shielding material 358, 368, 378 can be wrapped around the separator 350, 360, 370. The shielding material 358, 368, 378 can be formed of any material, such as the tape materials discussed in more detail below. In some embodiments, the shielding material can be an aluminum mylar film. For other embodiments, the shielding material can be a multi-layer tape material, as discussed below with respect to FIGS. 13A, 13B, 13C, 13D, or a nonwoven material, as discussed below with respect to FIG. 14.

Other exemplary embodiments of separators are disclosed in US Publication No. 2010/0206609, filed Apr. 6, 2010, entitled "High Performance Support-Separators for Communications Cables Providing Shielding for Minimizing Alien Crosstalk," US Publication No. 2007/0151745, filed Mar. 2, 2007, entitled "High Performance Support-Separators for Communications Cables," US Publication No. 2008/0066947, filed Jul. 16, 2004, entitled "Support Separators for Communications Cable," and U.S. Pat. No. 7,098,405, filed May 1, 2002, entitled "High Performance Support-Separator for Communications Cables," the teachings of which are each incorporated herein by reference in their entirety.

In some embodiments, the separator 200 can include a plurality of electrically conductive inclusions 215 (e.g., metal inclusions), as shown schematically in FIGS. 2A and 2B and described in more detail above with respect to those figures. For example, in some embodiments, the central portion 202 of the separator can include a plurality of electrically conductive inclusions. In some embodiments, the flap portions 204 can include an electrically conductive coating or layer 217 that extends along the length of that portion, e.g., as shown schematically in FIGS. 8A and 8B and described in more detail above with respect to those figures. For example, the electrically conductive layer 217 can be continuous or discontinuous. In some embodiments, the flap portions 204 of the separator 200 can include an electrically conductive coating or layer 217 and the central portion 202 can include a plurality of electrically conductive inclusions 215. The electrically conductive coating or layer 217 can be disposed on the outer surface 212 of each flap portion 204, on an inner surface 214 of the channel 206 formed by the flap portion 204, or on both the inner surface 214 and the outer surface 212.

In another embodiment, the separator 200 can include an electrically conductive strip 219, 221 (e.g., a metal strip). In some embodiments, an electrically conductive strip 219 can be disposed internally within the central portion 202. In other embodiments an electrically conductive strip 221 can be disposed internally within the flap portions 204. In some embodiments, electrically conductive strips 219, 221 can be disposed internally within both the central portion 202 and the flap portions 204. In any of these embodiments, the metal strip 219, 221 can extend along the length of the separator from a proximal end to a distal end thereof to provide electromagnetic shielding between conductors (not shown) disposed within the channels formed by the separator. In some embodiments, a thickness of the internal metal strip can be in a range of about 6 microns to about 55 microns.

In some embodiments, the flap portions 204 of the separator 200 can include an internal electrically conductive strip and the central portion 202 can include a plurality of electrically conductive inclusions. In other embodiments, the flap portions 204 of the separator 200 can include a plurality of electrically conductive inclusions and the central portion 202 can include an internal electrically conductive strip. In other embodiments, the separator can include any combination of the electrically conductive inclusions 215, the electrically conductive layers 217, and the electrically conductive strips 219 discussed above with respect to FIGS. 8A, 8B, 9, 10A 10B, 10C, and 10D.

While in some embodiments of the separators discussed above the metal inclusions are distributed substantially uniformly within the body of the separator, e.g., as schematically depicted in the cross-sectional views of FIGS. 2A and 2B, in other embodiments, the spatial distribution of the metal inclusions can be non-uniform. For example, the density of inclusions, i.e., the number of inclusions per unit volume, in the flap portions can be greater than in the central portion. For another example, the density of inclusions in the central portion can be greater than in the flap portions.

Tapes

As discussed above, in another aspect, the invention provides tapes, e.g., for use in telecommunications cables, in which electrically conductive inclusions are incorporated. In some embodiments, the tapes can include a plurality of metal particles that are distributed therein to provide shielding of electromagnetic radiation. In many embodiments, such tapes are flexible so as to be configurable into a desired shape. For example, in some embodiments a tape can be curved or bent along its longitudinal axis so as to form a shape suitable for at least partially surrounding (wrapping) one or more conductors, e.g., a pair of twisted pair conductors. In some exemplary embodiments, a tape can be used as an overall shield for a cable that includes unshielded twisted pairs (with or without internal separators, e.g., crosswebs). This type of use can be referred to as shielded, unshielded twisted pair ("shielded UTP, or "S-UTP"). In some exemplary embodiments, a tape according to the present teachings can be used as an overall shield for a cable having shielded conductors, e.g., individual conductors or twisted pairs of conductors. The conductors can also be shielded using a tape according to the present teachings. This type of use can be referred to as shielded, individually shielded twisted pair, "shielded ISTP." In other exemplary embodiments, a tape can be used to shield the twisted pairs while the cable itself remains unshielded. This type of use can be referred to as "PIMF" or "PiMF," which traditionally refers to pairs in metal foil, but can also be used to refer to embodiments in which the tapes disclosed herein are used to shield the twisted pairs.

Figure 11:
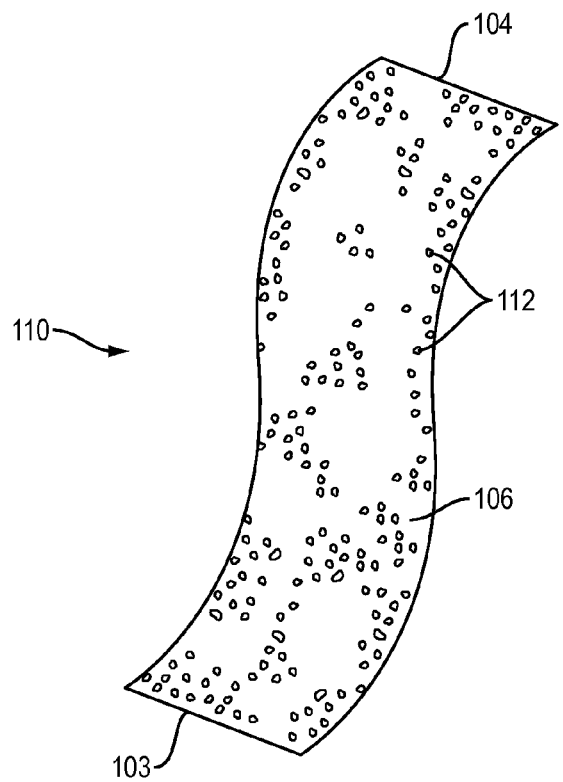
FIG. 11 schematically depicts a tape including a plurality of conductive inclusions according to an embodiment of the invention.

By way of example, FIG. 11 schematically depicts a tape 110 according to one embodiment of the invention that extends from a proximal end 103 to a distal end 104. The exemplar tape has a polymer body portion 106 in which a plurality of electrically conductive inclusions 112, e.g., metal particles, are distributed.

In some embodiments, the tape 110 has a thickness less than about 0.020 inches, e.g. in a range of about 0.001 inches to about 0.020 inches or in a range of about 0.001 inches to about 0.010 inches, or in a range of about 0.010 inches to about 0.020 inches. In some embodiments, the tape is formed of non-woven polymeric fabric in which a plurality of electrically conductive inclusions, e.g., metal particles, are incorporated, as discussed in more detail below.

In some embodiments, the tape can comprise a polymer, a polyolefin, or a fluoropolymer, e.g., a perfluoropolymer, such as FEP, MFA, PFA, and the metal inclusions are formed of a metal such as silver, aluminum, copper, gold, bronze, tin, zinc, iron, nickel, indium, gallium, or stainless steel. In some implementations, the tape can include two or more different polymers, polyolefins, fluoropolymers, such as perfluoropolymers, e.g., a blend of two of more of FEP, MFA and PFA. Further, in some cases, the metal inclusions can exhibit a variety of different shapes and/or be formed of different metals.

In this embodiment, the metal inclusions 112 can include two types, one of which exhibits a needle-like shape and the other a flat flake-like shape, as discussed in more detail above and as schematically depicted in FIGS. 2A and 2B.

In some embodiments, the metal inclusions 112 can comprise a volume fraction of the tape 110 in a range of about 1% to about 40%, or in a range of about 2% to about 30%, or in a range of about 3% to about 20%, or in a range of about 4% to about 15%, or in a range of about 5% to about 10%.

In some embodiments, the polymer, e.g., fluoropolymer, polyolefin, or combinations thereof, can comprise at least about 30%, or at least about 40%, or at least about 50%, or at least about 60%, or at least about 70%, or at least about 80%, or at least about 85%, or at least about 90%, or at least about 95% of the volume of the tape.

In some embodiments, the metal inclusions 50 can comprise a weight percent of the separator in a range of about 1% to about 30%, or in a range of about 5% to about 20%, or in a range of about 5% to about 15%, or in a range of about 10% to about 15%.

In some embodiments, the polymer, e.g., fluoropolymer, polyolefin, or combinations thereof, can comprise at least about 30 weight percent, or at least about 40 weight percent, or at least about 50 weight percent, or at least about 60 weight percent, or at least about 70 weight percent, or at least about 80 weight percent, or at least about 85 weight percent, or at least about 90 weight percent, or at least about 95 weight percent, of the tape.

In some embodiments, the tape 110 exhibits an axial DC (direct current) electrical conductivity that is in a range of about $1 \times 10^3$ Siemens/meter to about $3.5 \times 10^7$ Siemens/meter. Such an axial DC electrical conductivity ($\sigma$) can be measured between the two points on the tape 110 by applying a DC voltage (V) between the points e.g., by employing a voltage source 60, and measuring the DC current (I) flowing axially (i.e., in a direction from one point to another or vice versa) by using a DC current meter 64, e.g., in a manner shown in FIG. 4. Ohm's law can then be utilized to determine the DC electrical conductivity according to the following relation:

$$\sigma = \frac{I}{V} \qquad \text{Eq. 1}$$

wherein,
$\sigma$ denotes electrical conductivity,
V denotes DC voltage applied across the separator,
and I denotes DC current flowing through the separator in response to application of the voltage V.

In some embodiments, the tape 110 exhibits an AC (alternating current) conductivity (defined as the inverse of AC impedance) in a range of about $1 \times 10^3$ Siemens/meter to about $3.5 \times 10^7$ Siemens/meter for frequencies in a range of about 1 MHz to about 40 GHz. The AC conductivity can be measured by applying an AC voltage between two points on the tape and measuring the AC current through the tape 110 by using an AC current meter, e.g., in a manner shown in FIG. 4 with the DC voltage source 60 replaced with an AC voltage source and the DC current meter 64 replaced with an AC current meter. The AC conductivity can then be determined by using the following relation:

$$\sigma_{ac} = \frac{I_{max}}{V_{max}} \qquad \text{Eq. 2}$$

wherein,
$I_{max}$ denotes the maximum of the measured AC current and
$V_{max}$ denotes the maximum of the measured AC voltage.

In some embodiments, the tape 110 can exhibit a sheet resistance in a range of about $1 \times 10^{-5}$ ohms per square to about $1 \times 10^5$ ohms per square, or preferably about 10 ohms per square. As one of skill in the art will appreciate, the sheet resistance of a material will change depending on the thickness of the material. For example, sheet resistance (ohms per square) multiplied by the material thickness in centimeters equals the volume resistivity of the material (ohms-cm). As a result, the volume resistivity needed to achieve a given sheet resistance will depend on the thickness of the material in question. For example, a thicker material will provide the same volume resistivity with a less conductive material as a thinner material that is more conductive. As a more specific example, a tape with a thickness of 0.0254 cm (0.010 inches) can have a volume resistivity of 0.254 ohms-cm and a surface resistance of 10 ohms per square. If the thickness of the tape is reduced to 0.0127 cm (0.005 inches), the volume resistivity must be reduced by half to 0.127 ohms-cm to achieve the same surface resistance of 10 ohms per square.

In some embodiments, the tape 110 can have a shielding effectiveness in a range of about 15 dB to about 90 dB, or in a range of about 15 dB to about 50 dB, or in a range of about 50 dB to about 90 dB. Shielding effectiveness can be measured according to ASTM D4935-99: Standard Test Method for Measuring the Electromagnetic Shielding Effectiveness of Planar Materials, the contents of which are incorporated herein by reference.

The tapes and separators discussed above can be made using any techniques known in the art for processing polymers. In an exemplary embodiment, the tapes and separators can be produced by extruding the polymer compositions, as discussed above.

Figure 12:
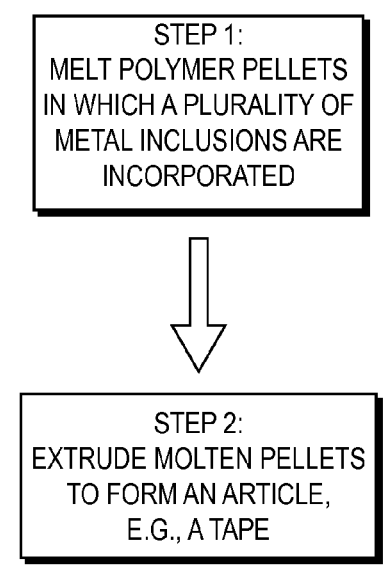
FIG. 12 is a flow chart of an exemplary method of manufacturing a cellular article, such as a tape, according to an embodiment of the invention.

The above tape 110 having a plurality of electrically conductive inclusions can be manufactured in a variety of ways. By way of example, with reference to flow chart of FIG. 12, in one exemplary method of manufacturing the tape 110, a plurality of polymer pellets, e.g., fluoropolymer or polyolefin pellets, in which metal inclusions are incorporated, such as the pellets discussed above, can be melted (step 1) and the molten pellets can be extruded to form the tape 110 (step 2).

Figure 13A:
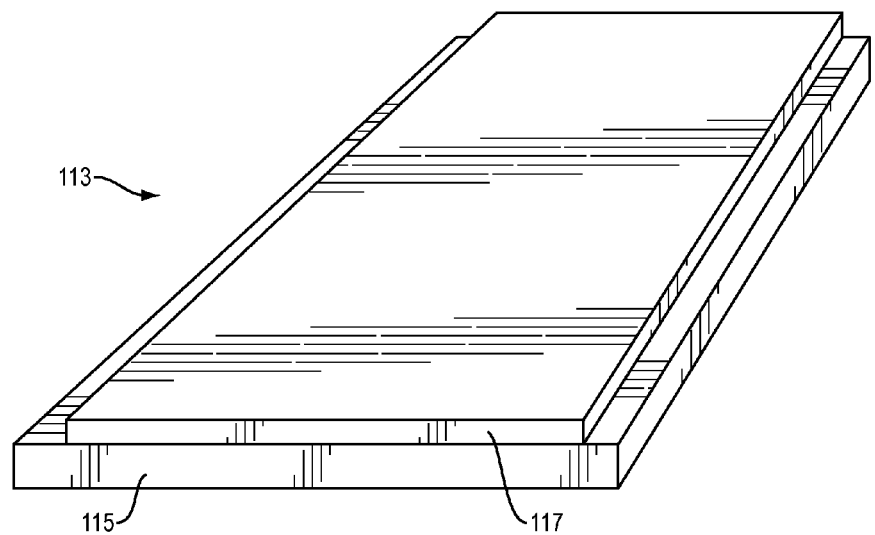
FIG. 13A schematically depicts a multi-layer tape including a polymeric substrate and a metallic layer, according to an embodiment of the invention.

FIG. 13A schematically depicts a multi-layered tape 113 according to an embodiment of the invention that includes a substrate layer 115 formed from a polymeric material. By way of example, in some embodiments, the substrate layer 115 is formed of a fluoropolymer, e.g., a perfluoropolymer. Some examples of suitable polyolefins or fluoropolymers for forming the substrate layer 115 include, without limitation, FEP, MFA, PFA, PVF, PTFE, ETFE, ECTFE, PVDF, combinations thereof, or other suitable fluoropolymers or polyolefins. In some embodiments, the polymeric substrate 115 is a foamed substrate, e.g., a substrate having pockets of gas (e.g., air) formed therein. By way of example, foamed polymeric compositions and methods for forming such composition are disclosed in U.S. application Ser. No. 12/221,280, filed Aug. 1, 2008, entitled "Compositions for Compounding, Extrusion, and Melt Processing of Foamable and Cellular Fluoropolymers," now issued as U.S. Pat. No. 7,968,613, the teachings of which are incorporated herein by reference, can be employed in some embodiments for generating the polymeric substrate 115. Alternatively, in some other embodiments, the polymeric substrate 115 can be a solid substrate. In other embodiments, the polymeric substrate can be a non-woven polymeric fabric, as discussed in more detail below. In some embodiments, the thickness of the substrate layer can be less than about 0.020 inches, e.g., in a range of about 0.001 inches to about 0.020 inches or in a range of about 0.001 inches to about 0.010 inches, or in a range of about 0.010 inches to about 0.020 inches, though other thicknesses can also be utilized.

The polymeric substrate 115 can be electrically insulative, dissipative or conductive. In some embodiments, the polymeric substrate 115 includes a plurality of electrically conductive inclusions (e.g., metal inclusions) distributed therein, e.g., in a manner discussed above. In some embodiments the density of the electrically conductive (e.g., metal) inclusions are sufficiently high such that the inclusions form an interconnected network to form, e.g., an electrically conductive polymeric substrate. In other embodiments the density of the metal inclusions can be less such that the inclusions are substantially separated from one another to form, e.g., a dissipative polymeric substrate.

The multi-layered tape 113 can further include a thin metallic layer 117 (e.g., an aluminum foil layer in this implementation) that is disposed over a surface of the underlying substrate 115. The thin metallic layer can have a thickness, e.g., in a range of about 50 angstroms to about 300 angstroms.

Figure 13B:
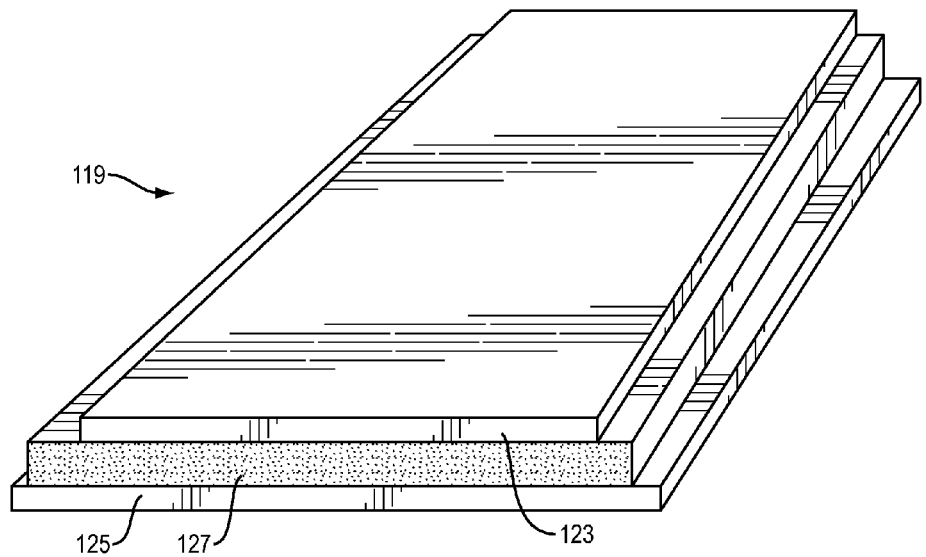
FIG. 13B schematically depicts a multi-layer tape including a polymeric substrate, a nonwoven fabric layer, and a metallic layer, according to an embodiment of the invention.

FIG. 13B schematically depicts another embodiment of a multi-layered tape 119 that includes a substrate layer 125 formed from a polymeric material, e.g., as discussed in more detail above. The multi-layer tape can further include a non-woven polymeric fabric layer 127 disposed over the substrate layer 125. The non-woven polymeric fabric layer can be electrically insulative, dissipative or conductive. Non-woven polymeric materials suitable for used in this and other embodiments are discussed in more detail below.

In some embodiments, the non-woven polymeric layer includes a plurality of electrically conductive inclusions (e.g., metal inclusions) distributed therein, e.g., in a manner discussed above. In some implementations, the metal inclusions can have a variety of different shapes. For example, some metal inclusions can have a shape (e.g., a flake-like shape) that is suitable for primarily dissipating electromagnetic radiation incident thereon having a frequency in a range of about 1 MHz to about 40 GHz or in a range of about 1 MHz to about 10 GHz, or in a range of about 1 MHz to about 2 GHz, or in a range of about 1 MHz to about 1.5 GHz, while some other inclusions can have a different shape (e.g., a needle-like shape) that is suitable for primarily reflecting electromagnetic radiation incident thereon having a frequency in a range of about 1 MHz to about 40 GHz or in a range of about 1 MHz to about 10 GHz, or in a range of about 1 MHz to about 2 GHz, or in a range of about 1 MHz to about 1.5 GHz.

In some embodiments, the density of the electrically conductive inclusions (e.g., metal inclusions) distributed within the non-woven fabric layer 127 is sufficiently high such that the metal inclusions form an electrically conductive network so as to form, e.g., an electrically conductive non-woven layer. In other embodiments, the density of the electrically conductive inclusions (e.g., metal inclusions) distributed within the non-woven fabric layer is less and the inclusions are substantially separate from one another so as to form, e.g., a dissipative non-woven layer.

In other embodiments, the non-woven layer 127 is free of electrically conductive inclusions.

In some embodiments, the multi-layered tape can provide shielding of electromagnetic radiation over a wide range of frequencies, e.g., in a range of about 1 MHz to about 10 GHz. While the thin metal layer can provide effective shielding at relatively low frequencies (e.g., frequencies less than about 10 MHz), the electrically conductive nonwoven layer and the polymeric substrate can provide effective shielding at higher frequencies (e.g., frequencies greater than about 10 MHz). For example, the nonwoven layer and the polymeric substrate, alone or in combination with each other, can provide effective shielding in a frequency range of about 500 MHz to about 1 GHz, in a range of about 500 MHz to about 10 GHz, in a range of about 1 MHz to about 40 GHz, in a range of about 1 MHz to about 10 GHz, in a range of about 1 MHz to about 2 GHz, or in a range of about 1 MHz to about 1.5 GHz.

Figure 13C:
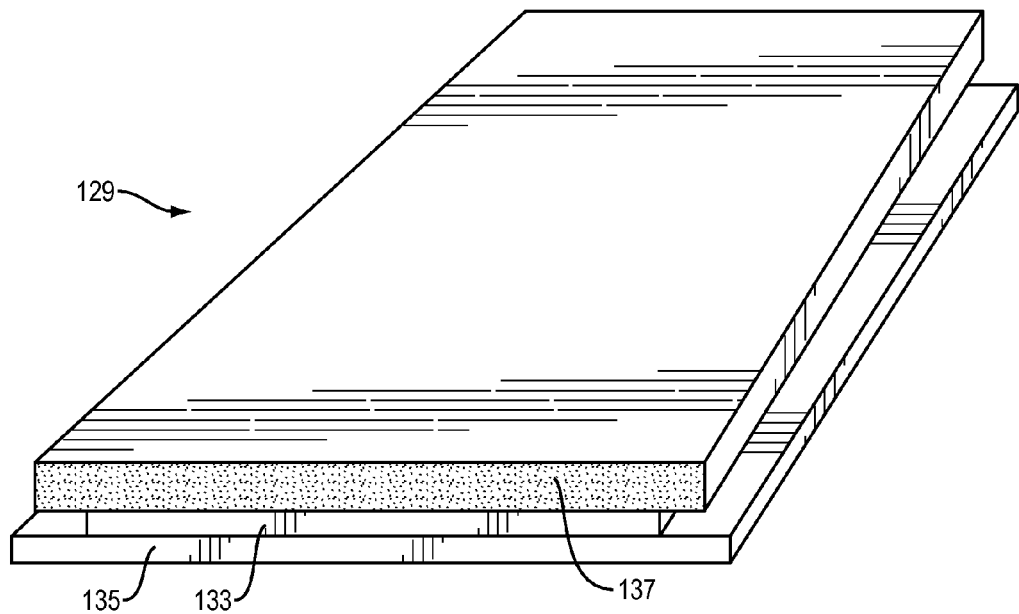
FIG. 13C schematically depicts a multi-layer tape including a polymeric substrate, a metallic layer, and a nonwoven fabric layer, according to an embodiment of the invention.

FIG. 13C schematically illustrates a modified version of the multi-layered tape discussed above in connection with FIG. 13B in which a thin metallic layer 133 (e.g., an aluminum foil layer) is disposed between an underlying polymeric substrate 135 and a non-woven fabric layer 137. Similar to the non-woven fabric layer 127 discussed above in connection with FIG. 13B, this non-woven layer 137 can be formed of a polymeric material, such those discussed above. While in some embodiments, the non-woven fabric layer includes a plurality of electrically conductive inclusions (e.g., metal inclusions) distributed therein, in other embodiments the non-woven fabric layer 137 is free of such inclusions.

Figure 13D:
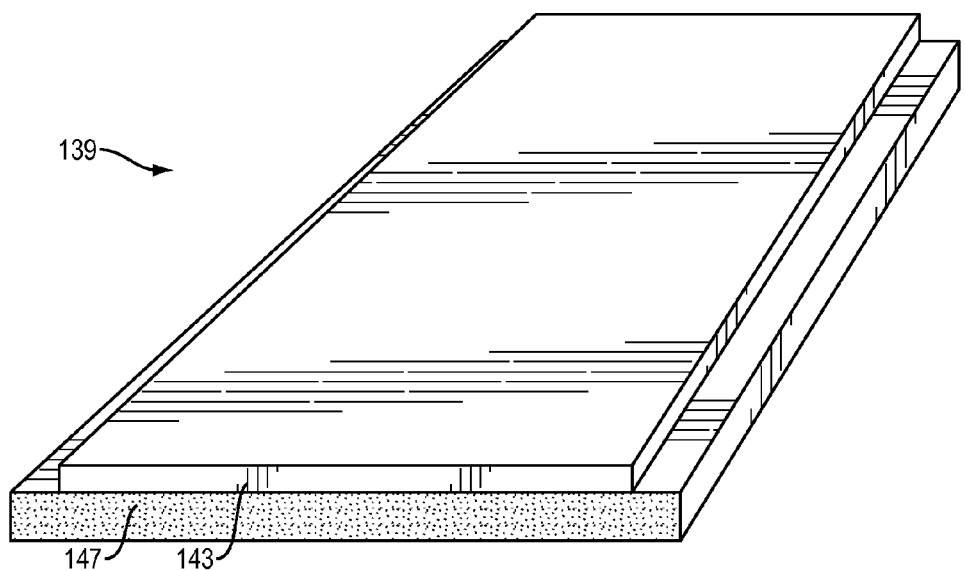
FIG. 13D schematically depicts a multi-layer tape including a metallic layer, and a nonwoven fabric layer, according to an embodiment of the invention.

FIG. 13D depicts schematically another multi-layered tape according to another embodiment of the invention that includes a thin metallic layer 143 (e.g., an aluminum foil layer) over a surface of which a non-woven fabric layer 147 is disposed. In some embodiments, the thin metallic layer and the non-woven fabric layer can be mechanically bonded to one another, as discussed in more detail below. The non-woven fabric layer can be electrically insulative, dissipative or conductive. In some embodiments, the non-woven fabric layer 147 includes a plurality of electrically conductive (e.g., metal) inclusions while in other embodiments the non-woven fabric layer 147 is free of such inclusions. In some embodiments in which the non-woven fabric layer 147 includes electrically conductive inclusions, the inclusions form an interconnected network while in other such embodiments the inclusions are substantially separate from one another.

The multi-layered tapes discussed above can be used, for example, to provide shielding in a cable, as discussed in more detail below with respect to FIG. 16. In such applications the multi-layered tapes can provide numerous benefits. For example, multi-layered tapes according to the embodiments schematically illustrated in FIGS. 13A, 13B, and 13C, 13D can provide the benefit of reduced insertion loss when used in such a cable. For example, when used to encircle conductors in a cable, the substrate layer, 115, 125, 135, provides a spacing between the conductive layer, e.g., metallic layer 117, 123, 133 and the conductors encircled by the tape. The spacing between conductors and the conductive layer can reduce insertion loss in the cable.

Multi-layered tapes according to the embodiment schematically illustrated in FIG. 13D can provide the benefit of shielding over a wide frequency range. For example, an insulative, dissipative, or conductive nonwoven layer can provide electromagnetic shielding at a different frequency range than a metallic layer. The combination of an insulative, dissipative, or conductive nonwoven layer and a metallic layer can thus provide effective shielding over a wide range of frequencies.

The multi-layer tapes discussed above can be manufactured in a variety of ways. By way of example, the polymeric substrate layer, e.g., layer 115 in FIG. 13A, can be manufactured in accord with the methods discussed above for producing tapes from polymer, e.g., fluoropolymer or polyolefin, pellets. The non-woven polymeric fabric layer, e.g., layer 127 in FIG. 13B, can be manufactured in accord with the methods discussed in more detail below for producing non-woven materials. The various layers, e.g., polymeric substrate layer, nonwoven fabric layer, and metallic layer can be bonded to their adjacent layer using various techniques. In some embodiments, the layers can be bonded using an adhesive or other bonding agents. In other embodiments, the layers can be mechanically affixed or bonded to one another. For example, the metallic layer can be joined to a nonwoven layer by needlepunching, as discussed in more detail below. For another example, the polymeric layer and/or the nonwoven fabric layer can be thermally bonded to each other or to the metallic layer by selectively heating portions of the layers to a temperature sufficient to melt the polymer components, e.g., by ultrasonic welding or calender bonding.

In other examples, the polymeric layer and/or the nonwoven fabric layer can be thermally bonded to each other or to the metallic layer by ultrasonic bonding. For example, the layers of material can be drawn between a horn, which provides high frequency sound waves, and a rotary calendar, referred to as an anvil. The sound energy can generate localized heat through mechanical vibration at the embossing points of the anvil, thereby fusing the material.

Other exemplary embodiments of methods of manufacturing tapes are disclosed in U.S. application Ser. No. 12/221,280, filed Aug. 1, 2008, entitled "Compositions for Compounding, Extrusion, and Melt Processing of Foamable and Cellular Fluoropolymers," now issued as U.S. Pat. No. 7,968,613, the teachings of which are incorporated herein by reference in their entirety.

Nonwovens

Figure 14:
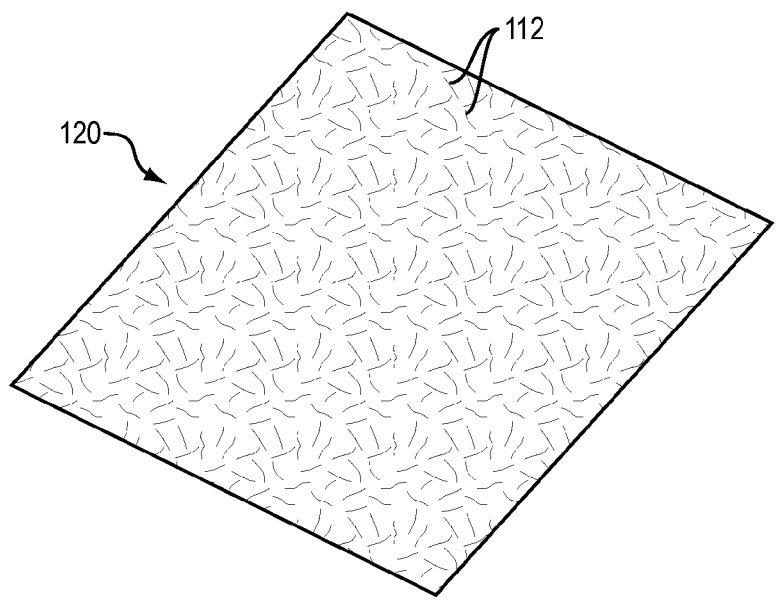
FIG. 14 schematically depicts a nonwoven material including a plurality of conductive fibrils according to an embodiment of the invention.

In another aspect, the invention provides nonwoven fabrics incorporating electrically conductive elements, e.g., electrically conductive inclusions. The nonwoven fabrics can be used as tapes, which can be used as an overall shield or as a shield for individual conductors or pairs of conductors, as discussed in more detail above. For example, FIG. 14 schematically depicts a nonwoven fabric 120 including a plurality of conductive fibrils 122. The conductive fibrils can be made of any suitable electrically conductive material. In some embodiments, the conductive fibrils can be formed of a metal such as copper, silver, aluminum, gold bronze, tin, zinc, iron, nickel, indium, gallium, or stainless steel. In some embodiments the conductive fibrils can be formed of metal alloys, such as, for example, tin alloys, gallium alloys, or zinc alloys. In other embodiments, the conductive fibrils can be formed of metal oxides, such as, for example, copper oxide, bronze oxide, tin oxide, zinc oxide, zinc-doped indium oxide, indium tin oxide, nickel oxide, or aluminum oxide. In some embodiments, the conductive elements incorporated into the nonwoven fabric can be in the form of electrically conductive fibers, such as monofilaments, yarns, threads, braids, bundles, chopped foil, e.g., tinsel, or combinations thereof.

The nonwoven fabric 120 can include interlocking layers or networks of fibers, filaments, or film-like filamentary structures. In some embodiments, the nonwoven fabric 122 can be formed from webs of previously prepared/formed fibers, filaments, films, or tapes processed into arranged networks of a desired structure. In some embodiments, the previously prepared or formed fibers, filaments, or films can be produced by extruding or otherwise processing the polymer compositions discussed above, e.g., polymer compositions comprising conductive inclusions.

For example, multi-filaments of yarns with individual filament diameters in the range of about 0.0005 to about 0.005, or in the range of about 0.001 inches to about 0.002 inches can be chopped into staple fibers. The lengths of these staple fibers can vary. For example, in some embodiments the staple fibers can have a length in the range of about 0.24 inches to about 3 inches. The staple fibers can be processed to form nonwoven fabric via various web forming processes.

In some embodiments, the nonwoven fabric 120 can include polymer fibers that are bonded together by processes other than weaving or knitting. A variety of polymers, e.g., polyolefins or fluoropolymers, including perfluoropolymers, can be employed to form the fibers. By way of example, the fibers can be formed of any of FEP, MFA, PFA, PVF, PTFE, ETFE, ECTFE, PVDF. In some embodiments, some of the fibers are formed of one polymer and the others are formed of another polymer.

Those having skill in the art will recognize that dry laid nonwovens include those nonwovens formed by garneting, carding, and/or aerodynamically manipulating dry fibers in the dry state. Nonwovens can also be formed by extruding a polymer through a linear or circular spinnerette. The extruded polymer streams are then rapidly cooled and attenuated by air and/or mechanical drafting rollers to form filaments of the desired diameter. The filaments can then be laid down onto a conveyor belt to form a web. The web can then be bonded to form a spunbonded web.

In other embodiments, nonwovens can also be formed by a melt blowing process. In such a process, a polymer can be extruded through a linear die containing a plurality of small orifices. Convergent streams of hot air can then rapidly attenuate the extruded polymer streams to form fibers with extremely fine diameters. The attenuated fibers can then be blown by high velocity air onto a collector screen to form a melt-blown web. The fibers in the melt-blown web are laid together by a combination of entanglement and cohesive sticking.

In addition, wet laid nonwovens are well known to be formed from a fiber-containing slurry that is deposited on a surface, such as a moving conveyor. The nonwoven web can be formed after removing the aqueous component and drying the fibers. Hybrids of these nonwovens can be formed by combining one or more layers of different types of nonwovens by a variety of lamination techniques.

In some embodiments, the nonwoven fabric 120 preferably has a density and thickness, and other mechanical and electrical characteristics, suitable for use as an insulating separator in telecommunications cables. By way of example, in one embodiment, the density of the nonwoven fabric, with or without electrically conductive elements, can be in a range of about 0.1 $g/cm^3$ to about 9 $g/cm^3$. For example, in some embodiments, the density of the nonwoven material can be less than about 0.3 $g/cm^3$, or less than about 1.2 $g/cm^3$, or less than about 2 $g/cm^3$, or less than about 9 $g/cm^3$. The thickness of the nonwoven can be in the range of about 0.05 mm to about 5 mm. For example, in some embodiments, the thickness of the nonwoven can be in the range of about 0.05 mm to about 2 mm. In other exemplary embodiments, the thickness of the nonwoven can be in the range of about 0.2 mm to about 1 mm. In other exemplary embodiments, the thickness of the nonwoven can be in the range of about 1 mm to about 5 mm.

Exemplary embodiments of methods that can be used to form nonwoven fabrics are disclosed in U.S. application Ser. No. 12/586,658, filed Sep. 25, 2009, entitled "Apparatus and Method for Melt Spun Production of Non-Woven Fluoropolymers of Perfluoropolymers," now published as US Publication No. 2011/0076907, the teachings of which are incorporated herein by reference.

Figure 15A:
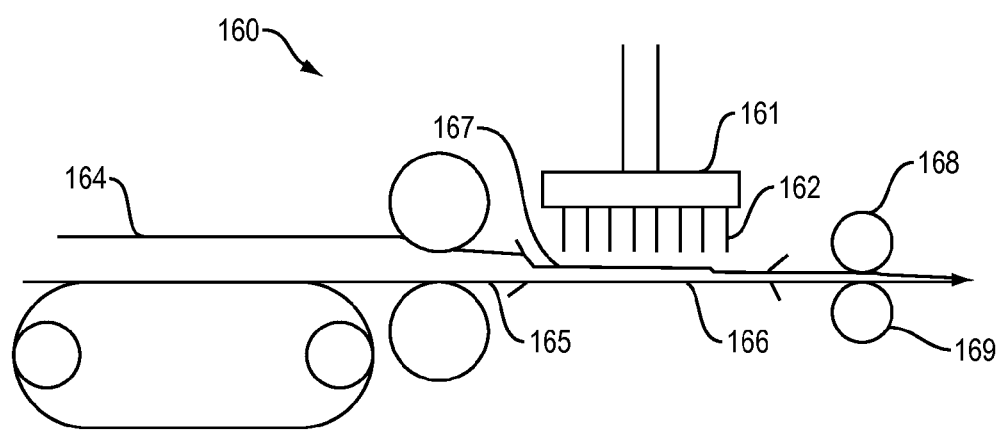
FIG. 15A schematically depicts an exemplary embodiment of a needlepunching apparatus according to an embodiment of the invention.

The nonwoven fabric 120 including electrically conductive fibrils 112 can be formed in a variety of ways. In some embodiments, electrically conductive elements 112 can be combined with a plurality of polymer fibers, e.g., polyolefin or fluoropolymer, such as perfluoropolymer, before or during the processing of the fibers into a nonwoven fabric. In other embodiments, electrically conductive elements, such as electrically conductive fibrils, can be applied to the nonwoven material itself, e.g., by needle punching the fibrils into the nonwoven material. In exemplary methods of needlepunching, barbed needles can be punched through layers of material, e.g., a metallic layer disposed on a non-woven layer. The needles hook tufts of fibers through the layers of material, bonding the layers together. For example, in an exemplary embodiment of a needle loom 160 schematically depicted in FIG. 15A, a needle board 161 including a plurality of needles 162 can be used to bond a first layer of material 164, e.g., a metallic layer, to a second layer of material 165, e.g., a nonwoven material. The needles 162 disposed on the needle board 161 can be driven so as to enter and leave the layers material 164, 165 while they pass between two plates commonly referred to as a bed plate 166 and a stripper plate 167. The layers of material 164, 165 can be pulled through the needle loom 160 by draw rollers 168, 169.

Figure 15B:
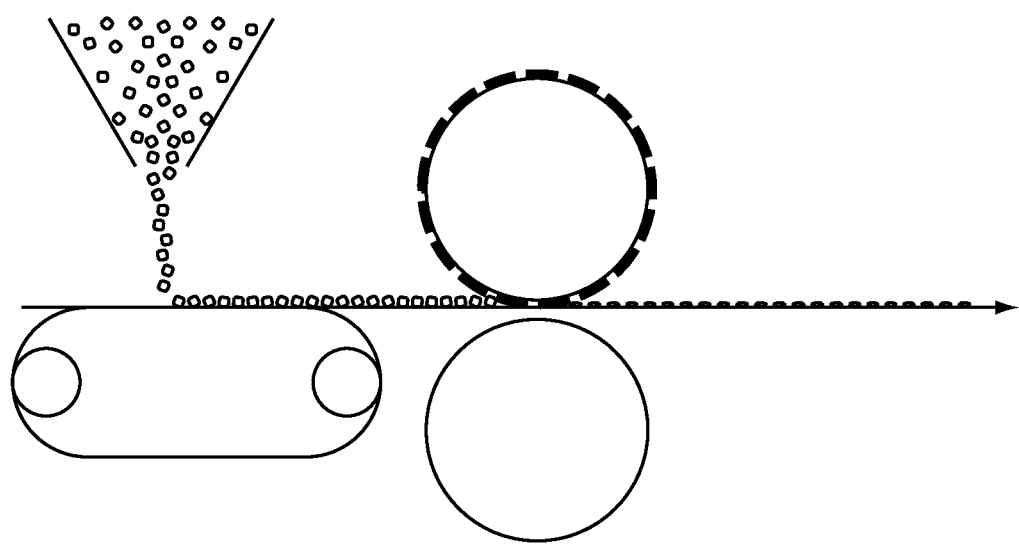
FIG. 15B schematically depicts an exemplary embodiment of a calender bonding apparatus according to an embodiment of the invention.

In other embodiments, electrically conductive elements can be applied to a nonwoven material by thermally bonding an electrically conductive material to the nonwoven material. For example, electrically conductive material, e.g., metal particles or chopped metal strands, or chopped metal foil, can be bonded to regions of nonwoven web material by calender bonding. FIG. 15B schematically depicts an exemplary embodiment of a calender bonding apparatus 170. The apparatus includes, for example, an embossed cylinder 172 and a smooth cylinder 173. A web of nonwoven material 174 passes between the cylinders. The cylinders 172, 173 are heated, e.g., to a temperature sufficient to soften the polymers used to form the nonwoven material. A plurality of electrically conductive elements 175 can be applied to the nonwoven web 174 as it passes through the apparatus 170. The web 174 with the electrically conductive elements 175 disposed thereon is drawn between the heated cylinders 172, 173. The embossed pattern on the embossed cylinder 172 exposes portions of the web 174 to heat and pressure, thereby bonding the electrically conductive elements 175 to the web 174.

In some embodiments, the nonwoven materials discussed above can exhibit a sheet resistance in a range of about $1 \times 10^{-5}$ ohms per square to about $1 \times 10^5$ ohms per square, or preferably about 10 ohms per square. As one of skill in the art will appreciate, the sheet resistance of a material will change depending on the thickness of the material. For example, sheet resistance (ohms per square) multiplied by the material thickness in centimeters equals the volume resistivity of the material (ohms-cm). As a result, the volume resistivity needed to achieve a given sheet resistance will depend on the thickness of the material in question. For example, a thicker material will provide the same volume resistivity with a less conductive material as a thinner material that is more conductive. As a more specific example, a tape with a thickness of 0.0254 cm (0.010 inches) can have a volume resistivity of 0.254 ohms-cm and a surface resistance of 10 ohms per square. If the thickness of the tape is reduced to 0.0127 cm (0.005 inches), the volume resistivity must be reduced by half to 0.127 ohms-cm to achieve the same surface resistance of 10 ohms per square.

In some embodiments, the nonwoven materials discussed above can have a shielding effectiveness in a range of about 15 dB to about 90 dB, or in a range of about 15 dB to about 50 dB, or in a range of about 50 dB to about 90 dB. Shielding effectiveness can be measured according to ASTM D4935-99: Standard Test Method for Measuring the Electromagnetic Shielding Effectiveness of Planar Materials, the contents of which are incorporated herein by reference.

Cables

In another aspect, the invention provides cables, e.g., telecommunications cables. The cables can include any of the tapes, the separators and the nonwoven fabrics discussed above to provide electromagnetic shielding of conductors disposed in the cable. In some embodiments, the cable can include various combinations of tapes, separators and nonwoven fabrics.

Figure 16:
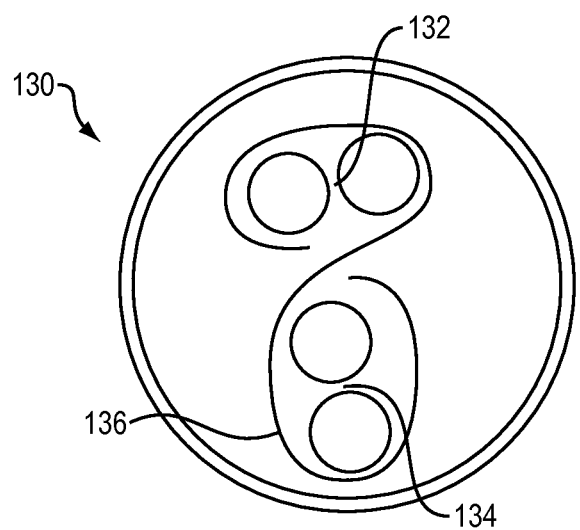
FIG. 16 schematically illustrates a cable including a tape in accordance with an embodiment of the invention.

By way of example, FIG. 16 schematically illustrates a cable 130 including two twisted pairs of conductors 132 and 134, and a tape 136 that is wrapped around the conductors 132 and 134 to provide electromagnetic shielding between the conductors 132 and 134.

As was discussed above, FIGS. 6A and 6B schematically illustrate other exemplary embodiments of cables that include separators. Other exemplary embodiments of cable in which separators according to the teachings of the invention can be employed are disclosed in U.S. application Ser. No. 12/754,737, filed Apr. 6, 2010, entitled "High Performance Support-Separators for Communications Cables Providing Shielding for Minimizing Alien Crosstalk," now published as US Publication No. 2010/0206609, the teachings of which are incorporated herein by reference in their entirety.

Cable Jackets

In another aspect, the invention provides a jacket for a cables, e.g., a telecommunications cable. In some embodiments, the jacket can include a plurality of electrically conductive inclusions, e.g., metal particles, that are distributed therein to provide shielding of electromagnetic radiation. For example, the jacket can be formed from any of the polymeric compositions disclosed herein. In another exemplary embodiment, rather than or in addition to distributing metal inclusions within a cable jacket, an electrically conductive layer can be embedded in the polymeric shell of the cable jacket. The electrically conductive layer can be adapted to provide electromagnetic shielding of one or more conductors.

Figure 17A:
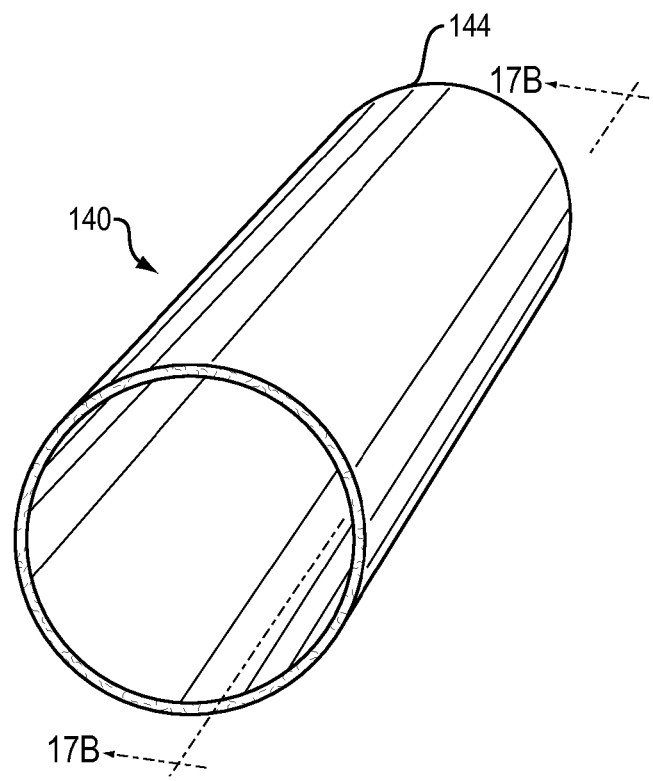
FIG. 17A schematically depicts a cable jacket according to an embodiment of the invention.
Figure 17B:
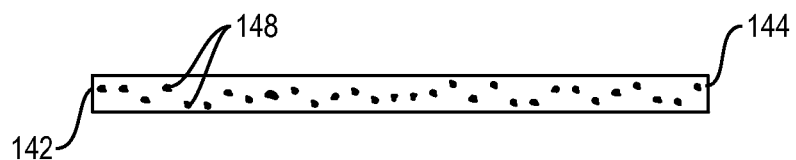
FIG. 17B schematically depicts a cross-sectional view of the cable jacket of FIG. 14A taken along line A-A.

By way of example, FIGS. 17A and 17B schematically depict a cable jacket 140 according to one embodiment of the invention that has an elongate tubular shape, which extends from a proximal end 142 to a distal end 144. The elongate tubular shape of the cable jacket forms a shell, e.g., a polymeric shell, having an interior lumen 146 adapted for housing one or more conductors. A plurality of metal inclusions 148 are distributed throughout the cable jacket 140. While in some embodiments the metal inclusions 148 are distributed substantially uniformly within the body of the cable jacket 140, e.g., as depicted in the cross-sectional view of FIG. 17B, in other embodiments, the spatial distribution of the metal inclusions can be non-uniform.

By way of example, in some embodiments, the density of the metal inclusions 148 in the proximity of the inner or outer surfaces, or both, of the wall of the jacket can be greater than a respective density in the center of the wall of the jacket. As discussed in more detail below, the metal inclusions facilitate shielding the conductors disposed in the jacket from conductors in other cables, thereby minimizing and preferably eliminating cross-talk between cables, i.e., alien cross-talk. In many embodiments, the cable jacket 140 is particularly effective in lowering alien cross-talk at a frequency range of about 1 MHz to about 10 GHz between neighboring cables.

In this exemplary embodiment, the cable jacket 140 is formed of a polymeric material in which a plurality of metal inclusions 148, e.g., metallic particles, are distributed. By way of example, in some implementations, the cable jacket 140 comprises a polyolefin, fluoropolymer (e.g., PVDF, PVF, ECTFE, or ETFE), or a perfluoropolymer (e.g., FEP, MFA or PFA) and the metal inclusions are formed of a metal such as copper, silver, gold aluminum, bronze, tin, alloys of tin, zinc, alloys of zinc, iron, nickel, indium, alloys of indium, gallium, alloys of gallium, or stainless steel. In other embodiments, the inclusions can be formed of metal oxides, such as, for example, copper oxide, bronze oxide, tin oxide, zinc oxide, nickel oxide, zinc-doped indium oxide, indium tin oxide, or aluminum oxide. In some implementations, the cable jacket comprises two or more different polymers, e.g., a blend of two of more of FEP, MFA, and PFA. Further, in some cases, the metal inclusions can exhibit a variety of different shapes and/or be formed of different metals.

In some embodiments, one type of the metal inclusions primarily reflect electromagnetic radiation within a frequency range (e.g., a frequency range of about 1 MHz to about 10 GHz) incident thereon while the other type of metal inclusions primarily absorb the incident radiation in that wavelength range. In this manner, effective shielding of conductors, e.g., twisted-pair wires, housed in the cable jacket can be achieved.

By way of example, in this exemplary embodiment, the metal inclusions 148 can include two types, one of which exhibits a needle-like shape and the other a flat flake-like shape, as shown in FIGS. 3A and 3B, and as discussed in more detail above.

In some embodiments, the metal inclusions 148 can comprise a volume fraction of the cable jacket 140 in a range of about 1% to about 40%, or in a range of about 2% to about 30%, or in a range of about 3% to about 20%, or in a range of about 4% to about 15%, or in a range of about 5% to about 10%.

In some embodiments, the polymer, e.g., fluoropolymer, polyolefin, or combinations thereof, can comprise at least about 30%, or at least about 40%, or at least about 50%, or at least about 60%, or at least about 70%, or at least about 80%, or at least about 85%, or at least about 90%, or at least about 95% of the volume of the cable jacket.

In some embodiments, the metal inclusions 148 can comprise a weight percent of the cable jacket in a range of about 1% to about 30%, or in a range of about 5% to about 20%, or in a range of about 5% to about 15%, or in a range of about 10% to about 15%.

The above cable jacket 140, or other pre-formed cellular articles, having a plurality of metal inclusions can be manufactured in a variety of ways. In one exemplary method of manufacturing the separator 10, a plurality of polymer pellets in which metal inclusions are incorporated, such as the pellets discussed above, can be melted and the molten pellets can be extruded to form the cable jacket 140.

Figure 18A:
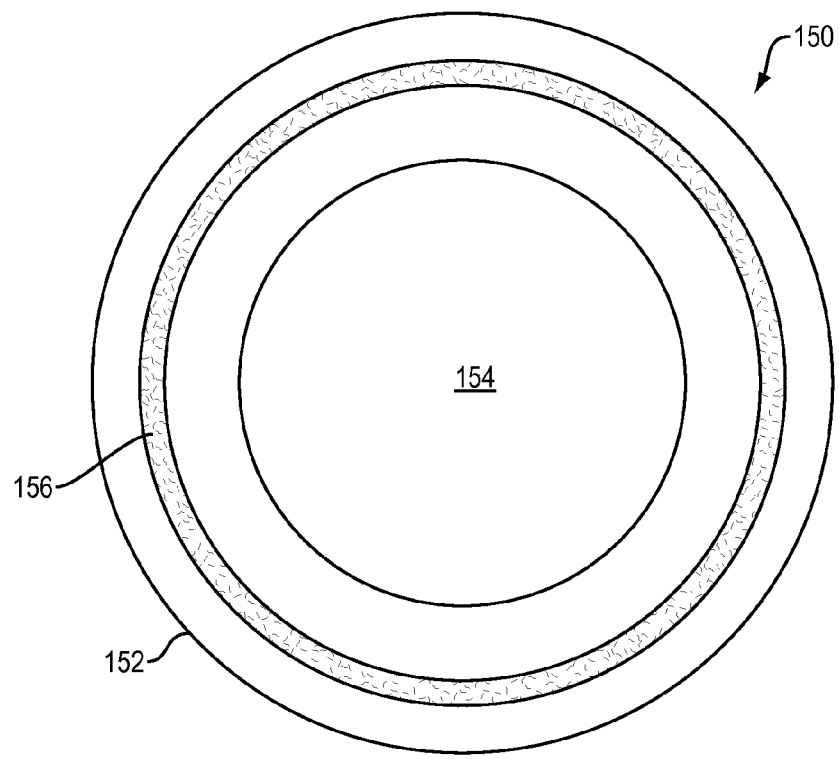
FIG. 18A schematically depicts a cable jacket having a metal layer embedded therein according to an embodiment of the invention.
Figure 18B:
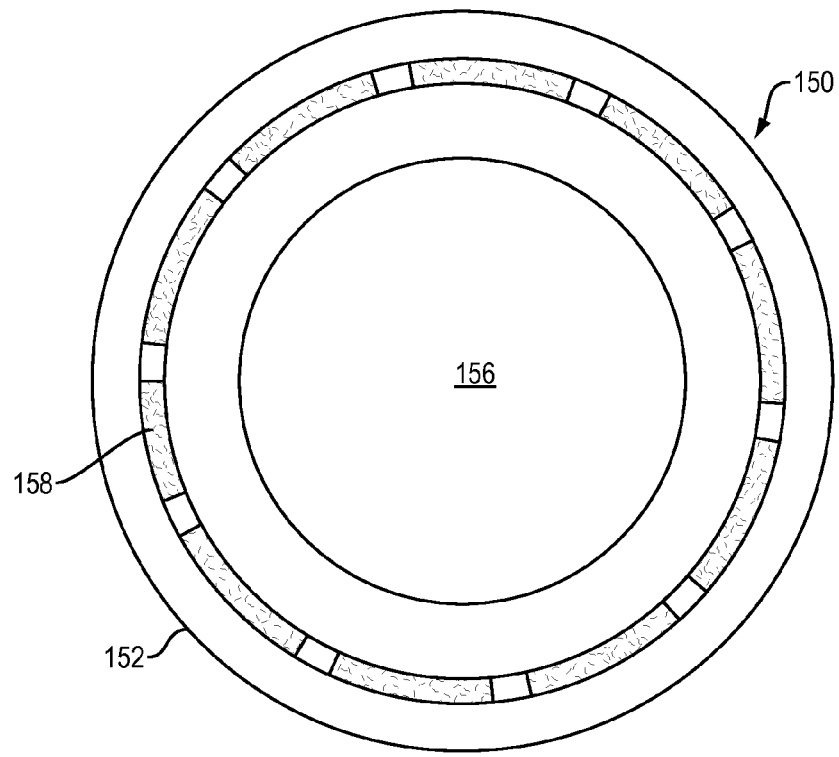
FIG. 18B schematically depicts a cable jacket having a discontinuous metal layer embedded therein according to an embodiment of the invention.

FIGS. 18A and 18B schematically depict a cable jacket 150 according to another exemplary embodiment of the invention that has an elongate tubular shape. The elongate tubular shape of the cable jacket forms a shell 152, e.g., a polymeric shell, having an inner lumen 154 adapted for housing one or more conductors. A metal layer 156 is embedded in the cable jacket 150. The thickness of the metal layer can be, e.g., in a range of about 0.001 inches to about 0.010 inches. A number of metals can be utilized to form the metal layer 156. By way of example, the metal layer can be formed of any of copper, silver, aluminum, copper, gold, bronze, tin, zinc, iron, nickel, indium, gallium, or stainless steel.

In some embodiments, the metal layer can be a continuous metal layer that extends along the length of the jacket from a proximal end to a distal end thereof to provide electromagnetic shielding between cables, e.g., as depicted in FIG. 18A. In other embodiments, the metal layer can be discontinuous. For example, the metal layer can be a checkered layer of metal 158, e.g., as depicted in FIG. 18B. In some cases, the metal layer can comprise at least about 30%, or at least about 40%, or at least about 50%, or at least about 60%, or at least about 70%, or at least about 80%, or at least about 90%, or at least about 95% of the surface area of the cable jacket.

The above cable jackets can be manufactured in a variety of ways. In one exemplary method of manufacturing the cable jackets, the metal layer can be co-extruded along with a plurality of fluoropolymer pellets to form the jacket.

EXAMPLES

To further elucidate various aspects of the invention, the following working examples are provided. The examples are provided only for illustrative purposes and are not intended necessarily to present optimal practice of the invention and/or optimal results that may be obtained by practicing the invention.

Conductive elements were combined with base polymers in a melt compounder and extruded into pelletized form. More specifically, aluminum (Al) pellets marketed under the trade designation Silvet 220-20-E, aluminum flakes marketed under the trade designation K101 (600 micron by 1000 micron rectangular pellets with a 25 micron thickness), stainless steel (SS) pellets marketed under the trade designation STAPA WM REFLEXAL 212/80, and copper powder marketed under the trade designation BR-83 UP COPPER were employed as conductive element. One or two of these conductive elements were incorporated into high density polyethylene (HDPE) and low density polyethylene (LDPE) base polymers, as shown in the following table, to generate pellets. The pellets were cast into dumbbell, rectangular, and circular plaques, and were tested for various properties, as shown in the Table 1 below:

TABLE 1

| Formulation | 1 | 2 | 3 | 4 | 5 | 6 | 7 | 8 |
|---|---|---|---|---|---|---|---|---|
| General Description | Aluminum (Al) Pellets | Al Flakes | Al Flakes & Al Pellets | Stainless Steel (SS) Pellets & | Al Powder | Al Powder & SS Pellets | Copper | Copper & Al Pellets |

TABLE 1-continued

| Formulation | 1 | 2 | 3 | 4 | 5 | 6 | 7 | 8 |
|---|---|---|---|---|---|---|---|---|
| Specific Recipe | 75% LDPE & 25% SILVET 220-20-E Al Pigment | 75% LDPE & 25% K101 Al Flakes | 75% LDPE, 15% K101 Al Flakes & 10% SILVET 220-20-E Al Pigment | Al Pellets 75% LDPE, 15% Beki-Shield GR75/C12-E/6 & 10% SILVET 220-20-E Al Pigment | 75% HDPE & 25% STAPA WM REFLEXAL 212/80 | 75% HDPE, 10% STAPA WM REFLEXAL 212/80, & 15% Beki-Shield GR75/C12-E/6 | 75% HDPE & 25% BR-83 UP COPPER | 75% HDPE, 10% BR-83 UP COPPER, & 15% SILVET 220-20-E Al Pigment |
| Source | SILBERLINE | Transmet Corporation | Transmet Corporation & SILBERLINE | BEKAERT & SILBERLINE | ECKART | ECKART & BEKAERT | ECKART | ECKART & SILBERLINE |
| Specific Gravity | 1.0396 | 1.0861 | 1.0641 | 1.0838 | 1.0693 | 1.0782 | 1.209 | 1.1149 |
| Tensile (psi) | 2892 | 1203 | 1960 | 1600 | 2719 | 3093 | 2802 | 3381 |
| Elongation | 55% | 46% | 64% | 109% | 55% | 36% | 46% | 46% |
| % Metallic Content | 20% | 28% | 22% | 19% | 20% | 19% | 25% | 22% |

One skilled in the art will appreciate further features and advantages of the invention based on the above-described embodiments. Accordingly, the invention is not to be limited by what has been particularly shown and described, except as indicated by the appended claims. All publications and references cited herein are expressly incorporated herein by reference in their entirety.

What is claimed:

1. A separator for use in a telecommunication cable, comprising
   a polymeric preformed elongate support element extending from a proximal end to a distal end and having at least one channel adapted for receiving a plurality of conductors,
   wherein said elongate support element comprises at least one base fluoropolymer and a plurality of electrically conductive elements distributed in said at least one fluoropolymer;
   wherein said electrically conductive elements have a plurality of different shapes comprising a first plurality of elements having a needle-like shape and a second plurality of elements having a flake-like shape;
   wherein said plurality of needle-like shaped elements have a length in a range of about 10 microns to about 1000 microns; and
   wherein said plurality of flake-like shaped elements have an average maximum cross-sectional dimension in a range of about 600 microns to about 6000 microns.

2. The separator of claim 1, wherein at least some of said electrically conductive elements are formed at least partially of a metal.

3. The separator of claim 1, wherein the first plurality of said conductive elements primarily-reflect electromagnetic radiation in a range of about 1.5 GHz to about 40 GHz.

4. The separator of claim 1, wherein the second plurality of said conductive elements primarily dissipate electromagnetic radiation in a range of about 1.5 GHz to about 40 GHz.

5. The separator of claim 1, wherein the separator exhibits a DC electrical conductivity along an axial direction in a range of about $1 \times 10^3$ Siemens/meter to about $3.5 \times 10^7$ Siemens/meter.

6. The separator of claim 1, wherein the separator exhibits a sheet resistance in a range of about $1 \times 10^{-5}$ ohms per square to about $1 \times 10^5$ ohms per square.

7. The separator of claim 1, wherein a weight ratio of said conductive elements to said one or more fluoropolymers is in a range of about 1 percent to about 30 percent.

8. The separator of claim 1, wherein said at least one base fluoropolymer comprises at least 50% by weight of said separator.

9. The separator of claim 1, wherein said at least one base fluoropolymer comprises at least about 60% by weight of said separator.

10. The separator of claim 1, wherein said at least one base fluoropolymer comprises at least about 70% by weight of said separator.

11. The separator of claim 1, wherein said at least one base fluoropolymer comprises at least about 75% by weight of said separator.

12. The separator of claim 1, wherein said at least one base fluoropolymer comprises at least about 80% by weight of said separator.

13. The separator of claim 1, wherein said at least one base fluoropolymer comprises at least about 85% by weight of said separator.

14. The separator of claim 1, wherein said at least one base fluoropolymer comprises at least about 90% by weight of said separator.

15. The separator of claim 1, wherein said at least one base fluoropolymer comprises at least about 95% by weight of said separator.

16. The separator of claim 1, wherein said electrically conductive elements comprise at least about 5% by weight of said separator.

17. The separator of claim 1, wherein said electrically conductive elements comprise at least about 7% by weight of said separator.

18. The separator of claim 1, wherein said electrically conductive elements comprise at least about 10% by weight of said separator.

19. The separator of claim 1, wherein said electrically conductive elements comprise at least about 15% by weight of said separator.

20. The separator of claim 1, wherein said electrically conductive elements comprise at least about 20% by weight of said separator.

21. The separator of claim 1, wherein said electrically conductive elements comprise at least about 25% by weight of said separator.

22. A separator for use in a telecommunication cable, comprising:
   a polymeric preformed elongate support element extending from a proximal end to a distal end and having at least one channel adapted for receiving a plurality of conductors, wherein said elongate support element comprises at least one base fluoropolymer; and a plurality of electrically conductive elements distributed in said at least one fluoropolymer, wherein said plurality of electrically conductive elements comprise a first plurality of elements having a needle-like shape and a length in a range of about 10 microns to about 1000 microns;

wherein said plurality of needle-like electrically conductive elements exhibit an aspect ratio greater than 75; and wherein said plurality of electrically conductive elements further comprise a second plurality of elements having a flake-like shape that exhibit an average maximum cross-sectional dimension in a range of 600 microns to 6000 microns.

23. The separator of claim 1, wherein the electrically conductive elements shield electromagnetic radiation in a range of about 1.5 GHz to about 40 GHz.

* * * * *